United States Patent
Perkins et al.

(10) Patent No.: US 12,202,738 B2
(45) Date of Patent: Jan. 21, 2025

(54) COMPOSITION, METHODS FOR ITS PRODUCTION, AND ITS USE

(71) Applicant: Ilika Technologies Limited, Romsey (GB)

(72) Inventors: Laura Perkins, Southampton (GB); William Richardson, Oxford (GB); Louise Turner, Salisbury (GB); Thomas Risbridger, Southampton (GB); Samuel Guerin, Southampton (GB); Brian Hayden, Lyndhurst (GB); Owain Clark, Southampton (GB); Robert Noble, Southampton (GB); Jean-Philippe Soulié, Bertem (BE); Patrick Casey, Ballina (IE); Kyriakos Giagloglou, Southampton (GB)

(73) Assignee: Ilika Technologies Limited, Romsey (GB)

(*) Notice: Subject to any disclaimer, the term of this patent is extended or adjusted under 35 U.S.C. 154(b) by 900 days.

(21) Appl. No.: 17/041,276

(22) PCT Filed: Apr. 2, 2019

(86) PCT No.: PCT/GB2019/050946
§ 371 (c)(1),
(2) Date: Sep. 24, 2020

(87) PCT Pub. No.: WO2019/193324
PCT Pub. Date: Oct. 10, 2019

(65) Prior Publication Data
US 2021/0371297 A1    Dec. 2, 2021

(30) Foreign Application Priority Data
Apr. 3, 2018   (GB) .................................. 1805627

(51) Int. Cl.
 *C01G 51/00*   (2006.01)
 *C23C 14/08*   (2006.01)
 (Continued)

(52) U.S. Cl.
 CPC ............ *C01G 51/42* (2013.01); *C23C 14/085* (2013.01); *C23C 14/3414* (2013.01);
 (Continued)

(58) Field of Classification Search
None
See application file for complete search history.

(56) References Cited

U.S. PATENT DOCUMENTS 5,885,544 A  3/1999 Yamazaki
9,899,661 B2 2/2018 Huang
(Continued)

FOREIGN PATENT DOCUMENTS

CN  105793462 A  7/2016
CN  106797049 A  5/2017
(Continued)

OTHER PUBLICATIONS

Antaya et al.; Preparation and characterization of LiCoO2 thin films by laser ablation deposition; Journal of the Electrochemical Society 140.3; 1993; p. 575.
(Continued)

*Primary Examiner* — Robert S Carrico
(74) *Attorney, Agent, or Firm* — Renner, Otto, Boisselle & Sklar, LLP

(57) ABSTRACT

Provided is a composition comprising: (a) a principal phase that is provided by a layered mixed metal oxide having a rocksalt structure belonging to the R-3m space group; the layered mixed metal oxide comprising the following component elements: 45 to 55 atomic % lithium; 20 to 55 atomic % of one or more transition metals selected from the group (Continued)

consisting of chromium, manganese, iron, nickel, cobalt, and combinations thereof; and 0 to 25 atomic % of one or more additional dopant elements selected from the group consisting of: magnesium, calcium, strontium, titanium, zirconium, vanadium, copper, ruthenium, zinc, molybdenum, boron, aluminium, gallium, tin, lead, bismuth, lanthanum, cerium, gadolinium and europium; wherein said atomic % is expressed as a % of total atoms of said layered oxide, excluding oxygen; (b)a minor phase that is provided by a metal oxide that does not have the crystal structure of the layered mixed metal oxide, the minor phase comprising one or more of the transition metals contained in the layered mixed metal oxide, the transition metals being selected from the group consisting of chromium, manganese, iron, nickel, and cobalt. Methods of making the composition and electrodes and cells, especially solid-state batteries, containing the composition are also provided. The rough morphology of the crystals confers advantages compared with smoother crystals of similar chemical composition, particularly in solid-state batteries.

14 Claims, 8 Drawing Sheets

(51) Int. Cl.
| C23C 14/34 | (2006.01) |
| H01M 4/04 | (2006.01) |
| H01M 4/131 | (2010.01) |
| H01M 4/1391 | (2010.01) |
| H01M 4/525 | (2010.01) |
| H01M 10/0525 | (2010.01) |
| H01M 10/0562 | (2010.01) |
| H01M 10/0565 | (2010.01) |

(52) U.S. Cl.
CPC ......... *H01M 4/0421* (2013.01); *H01M 4/131* (2013.01); *H01M 4/1391* (2013.01); *H01M 4/525* (2013.01); *H01M 10/0525* (2013.01); *H01M 10/0562* (2013.01); *H01M 10/0565* (2013.01); *C01P 2002/74* (2013.01); *C01P 2002/82* (2013.01)

(56) References Cited

U.S. PATENT DOCUMENTS

| 2003/0185743 | A1 | 10/2003 | Ramasamy | |
| 2010/0173098 | A1* | 7/2010 | Nagata | H01M 4/1395 427/576 |
| 2012/0015251 | A1* | 1/2012 | Oki | H01M 4/505 427/126.6 |
| 2012/0156566 | A1 | 6/2012 | Akalay et al. | |
| 2014/0205898 | A1 | 7/2014 | Lee et al. | |
| 2014/0272560 | A1 | 9/2014 | Huang | |
| 2016/0336583 | A1 | 11/2016 | Smith et al. | |
| 2016/0340772 | A1* | 11/2016 | Smith | C23C 14/08 |
| 2017/0317342 | A1 | 11/2017 | Kang et al. | |
| 2018/0190976 | A1 | 7/2018 | Blangero et al. | |

FOREIGN PATENT DOCUMENTS

| CN | 107810570 | A | 3/2018 |
| EP | 2757616 | B1 | 10/2017 |
| JP | 2001273903 | A | 10/2001 |
| JP | 2010086706 | A | 4/2010 |
| JP | 2011233402 | A | 11/2011 |
| WO | 0173883 | A2 | 10/2001 |
| WO | 2015104539 | A1 | 7/2015 |
| WO | 2017029899 | A1 | 2/2017 |

OTHER PUBLICATIONS

Bates et al.; Preferred orientation of polycrystalline LiCoO2 films; Journal of The Electrochemical Society 147.1; 2000; p. 59.
Bouwman et al.; Structure-related intercalation behaviour of LiCoO2 films; Solid State Ionics 152; 2002; pp. 181-188.
Bouwman et al; Structural analysis of submicrometer LiCoO2 films; Journal of the Electrochemical Society 148.4; 2001; p. A311.
Chang et al.;23 A-size rechargeable battery employing LiCoO2 thin-film cathode; Journal of power sources 54.2; 1995; pp. 403-405.
Chen et al.; Fabrication of LiCoO2 thin film cathodes for rechargeable lithium battery by electrostatic spray pyrolysis; Solid State Ionics 80.1-2; 1995; pp. 1-4.
Fragnaud et al.; Thin-film cathodes for secondary lithium batteries; Journal of power sources 54.2; 1995; pp. 362-366.
George et al.; Preferentially oriented BaTiO 3 thin films deposited on silicon with thin intermediate buffer layers; Nanoscale research letters 8.1; 2013; pp. 1-7.
Guerin et al.; Physical vapor deposition method for the high-throughput synthesis of solid-state material libraries; Journal of Combinatorial Chemistry 8.1; 2006; pp. 66-73.
Guillemin et al.; Critical nucleation effects on the structural relationship between ZnO seed layer and nanowires; The Journal of Physical Chemistry C 116.47; 2012; pp. 25106-25111.
Jo et al.; Effect of LiCoO2 cathode nanoparticle size on high rate performance for Li-ion batteries; Journal of The electrochemical society 156.6; 2009; p. A430.
Jung et al.; Influence of the substrate texture on the structural and electrochemical properties of sputtered LiCoO2 thin films; Thin solid films 546; 2013; pp. 414-417.
Kim et al.; Changes in the lattice constants of thin-film LiCoO2 cathodes at the 4.2 V charged state; Journal of The Electrochemical Society 151.7; 2004; p. A1063.
Kong et al.; Multivalent Li-site doping of Mn oxides for Li-ion batteries; The Journal of Physical Chemistry C 119.38; 2015; pp. 21904-21912.
Liao et al.; Lithium cobalt oxide cathode film prepared by rf sputtering; Journal of Power Sources 128.2; 2004; pp. 263-269.
Porthault et al.; Raman study of the spinel-to-layered phase transformation in sol-gel LiCoO2 cathode powders as a function of the post-annealing temperature; Vibrational Spectroscopy 62; 2012; pp. 152-158.
Rivas-Murias et al.; Thermodynamic CoO—Co3O4 crossover using Raman spectroscopy in magnetic octahedron-shaped nanocrystals; Journal of Raman Spectroscopy 48.6; 2017; pp. 837-841.
Tintignac et al.; High performance sputtered LiCoO2 thin films obtained at a moderate annealing treatment combined to a bias effect; Electrochimica acta 60; 2012; pp. 121-129.
Trask et al.; Optimization of 10-μm, sputtered, LiCoO2 cathodes to enable higher energy density solid state batteries; Journal of Power Sources 350; 2017; pp. 56-64.
Uchida et al.; Preparation of Binder-Free, Thin Film LiCoO2 and Its Electrochemical Responses in a Propylene Carbonate Solution; Journal of the Electrochemical Society 142.9; 1995; p. L139.
Xia et al.; Substrate effect on the microstructure and electrochemical properties of LiCoO2 thin films grown by PLD; Journal of alloys and compounds 417.1-2; 2006; pp. 304-310.
Yoon et al.; Lattice orientation control of lithium cobalt oxide cathode film for all-solid-state thin film batteries; Journal of power sources 226; 2013; pp. 186-190.
International Search Report and Written Opinion for corresponding International Application No. PCT/GB2019/050946 mailed Jul. 3, 2019.
Combined Search and Examination report for corresponding GB Application No. 1805627.5 mailed Oct. 5, 2018.
A.Yurgens, "Film Structure," pp. 1-10, dated Dec. 4, 2004, retrieved online at http://fy.chalmersse~yurgens/FKA196/FKA196.html.
Gummow, et al., Structure and Electrochemistry of Lithium Cobalt Oxide Synthesised at 400° C., Mat. Res. Bull., vol. 27, 1992, pp. 327-337.

(56) References Cited

OTHER PUBLICATIONS

Pan, Genhua, Thin Films for High-Density Magnetic Recording, Handbook of Thin Film Materials, edited by H.S. Nalwa, vol. 5: Nanomaterials and Magnetic Thin Films (2002), pp. 495-553.

Julien, C, et al., Fabrication of $LiCoO_2$ thin-film cathodes for rechargeable lithium microbatteries; Materials Chemistry and Physics 68, 2001, pp. 210-216.

McLaren, et al., Li+ ion conductivity in rock salt-structured nickel-doped $Li_3NbO_4$ †,, Dalton Trans., 2004, pp. 3042-3047.

Beaucarne, G., and Abdelilah, S., 3 Thin Film Polycrystalline Silicon Solar Cells, Thin Film Solar Cells, edited by J. Poortmans and V. Arkhipov, 2006, pp. 97-131.

Shirane, et al., Structure and physical properties of lithium iron oxide, $LiFeO_2$, synthesized by ionic exchange reaction, Solid State Ionics 79, 1995, pp. 227-233.

\* cited by examiner

COMPOSITION, METHODS FOR ITS PRODUCTION, AND ITS USE

This application is a national phase of International Application No. PCT/GB2019/050946 filed Apr. 2, 2019 and published in the English language, which claims priority to GB Patent Application No. 1805627.5 filed Apr. 3, 2018, all of which are hereby incorporated herein by reference in their entireties.

FIELD OF THE INVENTION

This invention relates to a composition containing a first phase provided by a layered mixed metal oxide having a rocksalt structure and a second phase provided by a metal oxide that does not have the crystal structure of the layered mixed metal oxide. In particular, the composition may contain $Co_3O_4$ and a crystalline oxide of lithium and cobalt, optionally containing one or more dopant elements as described herein. The invention also relates to methods for the production of the composition and its use, particularly as an electrode and in electrochemical cells, particularly lithium-ion batteries

BACKGROUND TO THE INVENTION

A lithium-ion battery is a type of rechargeable battery in which lithium ions ($Li^+$) move from the negative electrode to the positive electrode during discharge and back when charging. Lithium-ion batteries use a lithium intercalating compound as one electrode material, compared to the metallic lithium used in a non-rechargeable lithium-ion battery. The electrolyte, which allows for ionic movement, and the two electrodes are the constituent components of a lithium-ion battery.

Typically, lithium-ion batteries are composed of at least three components. Two active electrodes (the anode and the cathode) are separated by an electrolyte. Each of these components is formed as a thin film, deposited in sequence on a supporting substrate. Additional components such as current collectors, interface modifiers and encapsulations may also be provided. In manufacture, the components may be deposited in the order of cathode current collector, cathode, electrolyte, anode, anode current collector and encapsulation, for example.

In the lithium-ion example, the anode and the cathode are capable of reversibly storing lithium. Other requirements of the anode and cathode materials are high gravimetric and volumetric storage capacities which can be achieved from a low mass and volume of material, while the number of lithium ions stored per unit should be as high as possible. The materials should also exhibit acceptable electronic and ionic conduction so that ions and electrons can move through the electrodes during the battery charge and discharge process.

Many devices, particularly although not exclusively hand-held electronic devices, use lithium-ion batteries based on layered mixed metal oxides having a rocksalt structure belonging to the R-3m space group. These layered mixed metal oxides are of the formula type $Li_xM'_yO_2$, wherein M' is a transition metal selected from the group consisting of chromium, manganese, iron, nickel, cobalt, and combinations thereof. In this structure, alternate layers of lithium ions and ions of the transition metal occupy the octahedral sites of a cubic close packed lattice of oxide ions. Diffusion of lithium ions occurs preferentially along the lithium planes.

Examples of such mixed metal oxides include $Li_xMn_{1-y}M_yO_2$ (wherein M is a transition metal selected from the group consisting of chromium, iron, nickel, cobalt, and combinations thereof) and lithium cobalt oxide ($LiCoO_2$). $LiCoO_2$ has a hexagonal layered crystal structure, with $Li^+$ ions in octahedral sites between O—Co—O sheets. $Li^+$ diffusion occurs via vacancy hopping within the lithium planes.

It is known in the art that $Li^+$ mobility and therefore the electrochemical properties of the $LiCoO_2$ will strongly depend on the crystal orientation. The literature describes that optimised diffusion of Li is achieved for cathodes with orientations (101), (104) and (110). As described, for example, in Bates et al., cited below, and Trask et al., cited below, such lithium cobalt oxide textures are more favourable over the (003) where diffusion of Li ions is primarily restricted to grain boundary regions. The (110) orientation has the lithium planes aligned perpendicular to the substrate, this is favourable as it makes the lithium ions accessible and relatively easy to remove from the structure allowing for fast $Li^+$ diffusion and high lithium capacities. The (101) and (104) orientations have the lithium planes at slight angles compared to the (110) orientation still allowing for easy $Li^+$ removal and insertion into the structure. The (003) orientation consists of $Li^+$ planes aligned parallel to the substrate: this orientation is less favourable as the lithium ions are less accessible being effectively trapped in the structure.

A number of methods for producing lithium cobalt oxides are known in the art. For example, WO 2015/104539 describes a vapor deposition method for preparing crystalline lithium-containing compounds, including lithium cobalt oxides. A lithium cobalt oxide film is formed on a substrate when the component elements react on the substrate to form a crystalline material. The depositions described in WO 2015/104539 were carried out in a physical vapor deposition (PVD) system which has been previously described in the literature (Guerin, S. and Hayden, B. E., *Journal of Combinatorial Chemistry* 2006, 8, 66-73).

Bates et al. *J. Electrochem. Soc.* 2000, 147, 59-70 describes the production of lithium cobalt oxide films by sputtering using AC voltage (RF sputtering) from a $LiCoO_2$ target in a mixture of argon and $O_2$ at rates of 100-1000 nm/minute. Bates et al. reported that very thin lithium cobalt oxide films (thickness<0.5 µm) grown (RF sputtering) tend to prefer the (003) orientation to minimise surface energy, whereas thicker lithium cobalt oxide films (thickness<1 µm) develop preferred (101)-(104) orientation to minimise the volume strain energy developed in the annealing process. Bates et al. describe that X-ray amorphous films are obtained which are crystallised by annealing. $Co_2O_3$, $Co_3O_4$, $Li_{1.47}Co_3O_4$ and $Pt_3O_4$ are observed in the X-ray diffraction patterns of some films, but no further mention of these is made: it can be understood that these are a by-product of the annealing process as the films are stated to be X-ray amorphous before heating. Bates et al. also discusses the influence of substrate temperature. Deposition at high temperature leads to larger grains and increased void fraction (i.e. a greater fraction of empty spaces in the material, as a fraction of the volume of voids over the total volume). Bates et al. does not describe any attempt to introduce $Co_3O_4$ into the films or use it as a seeding layer, and provides no analysis of film composition.

Ceder et al. *J Alloys and Compounds* 2006, 417, 304-310 describes substrate effects on the orientation of lithium cobalt oxide films between 0.3-0.5 µm thick grown by pulsed laser deposition (PLD). Ceder et al. describes that stainless steel (SS) substrates give films with rough surfaces and random orientation, while silica/silicon ($SiO_2$/Si; SOS) substrates give relatively smooth surfaces with preferred (003) orientation. The electrochemistry described therein shows that the rough films deposited on SS have higher utilization of the film whereas the smooth films deposited on SOS have better capacity retention and structural stability. The reference indicates that all non-substrate peaks in the X-ray diffraction pattern are attributed to $LiCoO_2$ thin film and no impurity peaks such as $Co_3O_4$ can be seen from the XRD diffractogram.

Yoon et al. *J. Power Sources* 2013, 226, 186-190—use substrate temperature and/or a $Li_2O$ buffer layer to control the orientation of sputtered lithium cobalt oxide layers. At 400° C. films with (110) or (101) preferred orientation are obtained. In addition it is described that the $Li_2O$ buffer layer suppresses the formation of the (003) orientation and promotes the (110) orientation.

Bouwman et al. *Solid-state Ionics* 2002 152, 181-188, describes the production of lithium cobalt oxide films using RF sputtering and PLD. It is described that RF sputtering yields films with (110) orientation whereas PLD deposited films have a (003) orientation. The (110) orientated films utilise almost their full theoretical capacity during cycling whereas (003) films have inferior reversible capacity. The electrochemical properties of the (003) films can be improved by introducing defects and irregularities into the film by either heat treatment, the use of stainless steel substrates or lithographic patterning techniques. According to the method described in Bouwman et al., following the use of either RF sputtering or pulsed laser deposition (PLD) from a stoichiometric $LiCoO_2$ target, the films are annealed at 600° C. either in situ or ex situ. During the annealing process evaporation of volatile $Li_2O$ results in $Co_3O_4$ formation (estimated ~5% $Co_3O_4$).

However, the method of prolonged high temperature treatment taught in this document does not provide any control over the morphology of the lithium cobalt oxide film. Specifically, it is taught that when $LiCoO_2$ is deposited by means of PLD on an annealed RF seed layer, the existing (110) orientation is not continued, but overgrown with a preferential (00/) alignment. However, the film structure differs from that grown on a blank silicon substrate as not all (001) reflections are observed.

Bouwman et al. *J. Electrochem. Soc.* 2001, 148 (4), A311-A317, further describes the formation of lithium cobalt oxide films on a substrate, followed by annealing. It describes that some evolution of $Co_3O_4$ occurred during annealing at 600° C.: at elevated temperatures volatile $Li_2O$ is released and as a result $LiCoO_2$ is transformed. The process appeared to be accelerated by higher oxygen flows during annealing treatment. The (110) diffraction peak maximum of $LiCoO_2$ decreased with the increase of the $Co_3O_4$ reflections. Hence, this document teaches that annealing times should be kept as short as possible to prevent loss of active material.

Furthermore, the document describes that, to examine the consistency of the preferred lattice orientation towards each other of the films produced by PLD and by RF sputtering, a PLD film was grown on an RF-sputtered seed layer of 0.1 mm $LiCoO_2$ and annealed at 600° C. for 30 minutes. As a reference, PLD was simultaneously performed on a blank silicon substrate. This reference sample revealed the typical PLD film diffraction pattern, indicating (00/) lattice plane orientation. The PLD film deposited on the seed layer, which exhibited only the (110) reflection before PLD, showed distinct (006) and (0012) reflections, but the (003) and (009) reflections were completely absent. This result indicates that the film structure is not entirely determined by the deposition technique.

US 2014/0272560 A1 describes production of lithium cobalt oxides, altering the orientation of sputtered films by altering the substrate surface, addition of a seed layer of $LiCoO_2$ on the substrate surface and/or depositing a multilayer structure by sputtering lithium cobalt oxide under different conditions (changing the gases).

Trask et al. *J Power Sources* 2017, 350, 56-64, describes that altering the oxygen/argon ratio during sputtering to determine the crystallographic texture for 10 μm LCO films. Introducing only 4% $O_2$ suppresses the formation of the (003) orientation.

Liao et al. *J Power Sources* 2004, 128, 263-269 describes the deposition of lithium cobalt oxide films at low partial pressures of oxygen. Specifically, it describes that, for films deposited under working pressures other than 20 mTorr ($p_{O2}$=5 mTorr), a $Co_3O_4$ second phase is obtained in addition to the HT-$LiCoO_2$ phase. However, in the higher oxygen partial pressure region, the formation of a $Co_3O_4$ phase is due to Li deficiency in the film.

None of the prior art documents teach a crystalline lithium cobalt oxide composition having localised concentrations of $Co_3O_4$ nor that the presence of such a concentration would enable the production of lithium cobalt oxide with a crystal orientation with advantageous properties in lithium-ion batteries, such as capacity and cycle life. Nor does any of the prior art teach methods of producing a crystalline lithium cobalt oxide composition so as to form, in a controlled manner, localised concentrations of $Co_3O_4$ to enable the crystalline orientation of lithium cobalt oxide to be controlled.

SUMMARY OF THE INVENTION

According to a first aspect of the invention, there is provided a composition comprising:
(a) $Co_3O_4$, and
(b) crystalline lithium cobalt oxide or crystalline doped lithium cobalt oxide; said crystalline oxide comprising the following component elements:
45 to 55 atomic % lithium;
20 to 55 atomic % cobalt; and
0 to 25 atomic % of at least one additional dopant element selected from the group consisting of: magnesium, calcium, strontium, titanium, zirconium, vanadium, chromium, manganese, iron, copper, ruthenium, nickel, zinc, molybdenum, boron, aluminium, gallium, tin, lead, bismuth, lanthanum, cerium, gadolinium and europium;
wherein said atomic % is expressed as a % of total atoms of said crystalline oxide, excluding oxygen;
wherein 0.01% to 10% total mass (including oxygen) of said composition is $Co_3O_4$;
wherein 90% to 99.99% total mass (including oxygen) of said composition is crystalline lithium cobalt oxide or crystalline doped lithium cobalt oxide;
wherein said composition has a bottom surface and a top surface;
wherein said crystalline lithium cobalt oxide or crystalline doped lithium cobalt oxide has a crystalline structure characterized by at least one of the following parameters (a) to (c):
(a) at least one crystal orientation selected from the group consisting of: (101), (104), (110) and (012);

(b) a Raman spectrum comprising bands at 484 cm$^{-1}$, 593 cm$^{-1}$, and at least one band selected from the group consisting of: 690 cm$^{-1}$, 526 cm$^{-1}$, and 625 cm$^{-1}$ (each of said band ±25 cm$^{-1}$);

(c) at least one X-ray powder diffraction peak selected from the group consisting of: 2θ (±0.2° 37.4°, 39.1°, 45.3° and 66.4°.

According to a second aspect of the invention, there is provided a method of preparing the crystalline composition according to the first aspect of the invention, the method comprising the steps of:

providing a separate vapor source of each component element of the crystalline oxide, wherein each component element comprises cobalt, lithium, oxygen, and, optionally, at least one dopant element selected from the group consisting of: magnesium, calcium, strontium, titanium, zirconium, vanadium, chromium, manganese, iron, ruthenium, copper, molybdenum, nickel, zinc, boron, aluminium, gallium, tin, lead, bismuth, lanthanum, cerium, gadolinium and europium;

heating a substrate to between about 30° C. and about 900° C.;

co-depositing each component element onto the substrate, wherein the component elements react on the substrate to form crystalline oxide comprising lithium, cobalt and optionally one or more of the dopant elements; and co-depositing the cobalt and the oxygen onto the substrate, wherein the cobalt and the oxygen react on the substrate to form $Co_3O_4$.

According to a third aspect of the invention, there is provided an electrode comprising the composition of the first or seventh aspects of the invention. The electrode may be a positive electrode or a negative electrode. In one embodiment the electrode is a positive electrode.

According to a fourth aspect of the invention, there is provided an electrochemical cell comprising: an electrolyte; an anode; and a cathode; wherein the anode and/or the cathode comprises an electrode according to the third aspect of the invention. In one embodiment, the cathode comprises an electrode according to the third aspect of the invention.

According to a fifth aspect of the invention, there is provided a method of making a solid-state electrochemical cell, comprising depositing an electrode of the cell as a layer of the crystalline composition according to the first aspect of the invention using a method according to the second aspect of the invention.

According to a sixth aspect of the invention, there is provided an electronic device comprising an electrochemical cell according to the fourth aspect of the invention.

According to a seventh aspect of the invention, there is provided a composition comprising:

(a) a principal phase that is provided by a layered mixed metal oxide having a rocksalt structure belonging to the R-3m space group; the layered mixed metal oxide comprising the following component elements:

45 to 55 atomic % lithium;

20 to 55 atomic % of one or more transition metals selected from the group consisting of chromium, manganese, iron, nickel, cobalt, and combinations thereof; and 0 to 25 atomic % of one or more additional dopant elements selected from the group consisting of: magnesium, calcium, strontium, titanium, zirconium, vanadium, copper, ruthenium, zinc, molybdenum, boron, aluminium, gallium, tin, lead, bismuth, lanthanum, cerium, gadolinium and europium;

wherein said atomic % is expressed as a % of total atoms of said layered oxide, excluding oxygen;

(b) a minor phase that is provided by a metal oxide that does not have the crystal structure of the layered mixed metal oxide, the minor phase comprising one or more of the transition metals contained in the layered mixed metal oxide, the transition metals being selected from the group consisting of chromium, manganese, iron, nickel, and cobalt;

wherein the principal phase provides 90% to 99.5% of the total mass of the composition, and the minor phase provides 0.5% to 10% of the total mass of the composition.

Effectively, the minor phase may be considered to disrupt the crystal structure of the layered mixed metal oxide. In certain embodiments, the minor phase may be amorphous. In other embodiments, the minor phase may be crystalline, but have a crystal structure that is different to that of the layered mixed metal oxide, for example, belonging to a different space group. In certain embodiments, the minor phase may have a crystal structure belonging to the Fd-3m space group (this is the case when the minor phase is provided by, for example, $Co_3O_4$).

According to an eighth aspect, the present invention may provide a method of preparing a composition according to the seventh aspect of the invention, the method comprising the steps of:

providing a separate vapour source of each component element of the composition, wherein the vapour sources comprise at least:

a source of lithium, a source of a transition metal selected from the group consisting of chromium, manganese, iron, nickel, and cobalt, a source of oxygen, and, optionally, a source of at least one dopant element selected from the group consisting of: magnesium, calcium, strontium, titanium, zirconium, vanadium, copper, ruthenium, zinc, molybdenum, boron, aluminium, gallium, tin, lead, bismuth, lanthanum, cerium, gadolinium and europium;

heating a substrate to between about 30° C. and about 900° C.;

delivering a flux of each said component element onto the substrate, wherein the component elements react on the substrate to form a first phase that is provided by a layered mixed metal oxide having a rocksalt structure belonging to the R-3m space group; and delivering a flux of at least the transition metal and the oxygen onto the substrate, wherein the transition metal and the oxygen react on the substrate to form a second phase that is provided by a metal oxide that does not have the crystal structure of the first phase.

According to a ninth aspect, the present invention may provide a method of preparing a composition according to the seventh aspect of the invention, wherein the method is a sputtering deposition method comprising:

providing a sputtering target comprising a mixed metal oxide comprising lithium, one or more transition metals selected from the group consisting of chromium, manganese, iron, nickel, cobalt, and combinations thereof; and optionally one or more dopant elements selected from the group consisting of: magnesium, calcium, strontium, titanium, zirconium, vanadium, copper, ruthenium, zinc, molybdenum, boron, aluminium, gallium, tin, lead, bismuth, lanthanum, cerium, gadolinium and europium;

providing a further sputtering target comprising a metal oxide phase comprising one or more of the transition metals contained in the first sputtering target, the transition metals being selected from the group consisting of chromium, manganese, iron, nickel, and cobalt;

sputtering said sputtering target and said further sputtering target to produce a composition comprising:

a first phase that is provided by a layered mixed metal oxide of lithium and one or more of the transition metals, optionally doped with at least one of said dopant elements, and having a rocksalt structure belonging to the R-3m space group; and and a second phase that is provided by a metal oxide that does not have the crystal structure of the first phase, the second phase comprising one or more of the transition metals contained in the layered mixed metal oxide, the transition metals being selected from the group consisting of chromium, manganese, iron, nickel, and cobalt.

According to a tenth aspect of the invention, there is provided a method of making a solid-state electrochemical cell, comprising depositing an electrode of the cell as a layer of the composition according to the seventh aspect of the invention using a method according to the eighth or ninth aspect of the invention.

ADVANTAGES AND SURPRISING FINDINGS

Figure 1:
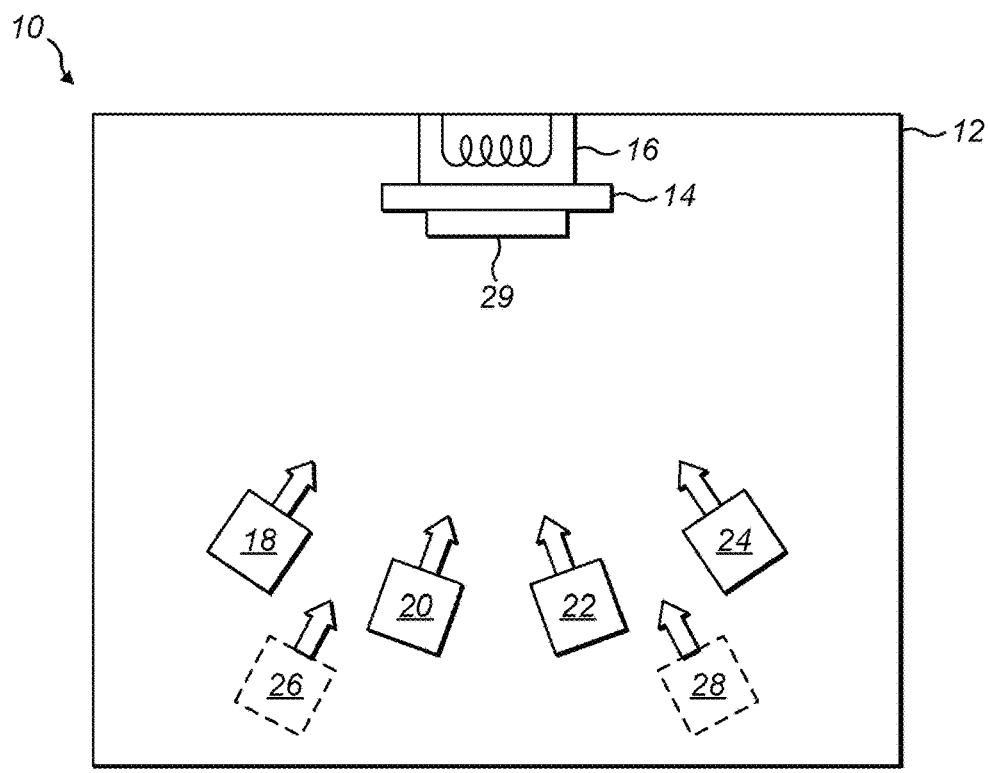
FIG. 1 is a schematic representation of an example apparatus suitable for implementing a method according to embodiments of the invention.

According to an aspect of the present invention, a crystalline lithium cobalt oxide is grown by various methods as disclosed herein, particularly although not exclusively physical vapor deposition (PVD). The lithium cobalt oxide films may be used in electrodes, for example, as a film on an inert substrate, and combined with an electrolyte, such as a lithium phosphorus oxynitride (LiPON) solid electrolyte, for use in an electrochemical cell, particularly a solid-state battery.

In general, layered mixed metal oxides containing lithium and one or more transition metals selected from the group consisting of chromium, manganese, iron, nickel, cobalt, and combinations thereof, and having a layered rocksalt structure belonging to the R-3m space group may be grown e.g. through PVD. The resulting films may be used in electrodes, for example, as a film on an inert substrate, and optionally combined with an electrolyte, such as a lithium phosphorus oxynitride (LiPON) solid electrolyte, for use in an electrochemical cell, particularly a solid-state battery. Such layered mixed metal oxides include, for example, $Li_xMn_{1-y}M_yO_2$ (wherein M is a transition metal selected from the group consisting of chromium, iron, nickel, cobalt, and combinations thereof), in addition to lithium cobalt oxide.

Conventionally, it is considered desirable to maximize the amount of electrode active material (such as lithium cobalt oxide or $Li_xMn_{1-y}M_yO_2$) in the electrode of a battery, and thus it is preferred to avoid the presence of other phases that do not contribute to overall battery capacity.

For example, cobalt oxide ($Co_3O_4$) is electrochemically inactive and considered an impurity in $LiCoO_2$ compositions. See, e.g., Jo et al. 2009 *J. Electrochem. Soc.* 156(6) A430-A434; Tintignac et al. 2012 *Electrochimica Acta* 60 121-129; Antaya et al. *J. Electrochem Soc* Vol. 140 No. 3 1993, each incorporated by reference in its entirety. The capacity of a battery with an $LiCoO_2$ cathode is defined by the amount of the $LiCoO_2$ material. The addition of $Co_3O_4$ to the $LiCoO_2$ material will therefore be at the expense of the overall battery capacity. In terms of energy density, (e.g. gravimetric energy density which defines capacity in weight (Wh/kg) any inclusion of $Co_3O_4$ is contributing to the weight but not providing any additional capacity. Purposely adding $Co_3O_4$ to a lithium oxide composition is therefore counterintuitive.

However, the inventors have surprisingly found that the methods disclosed herein allow the introduction, in a controlled manner, of localised concentrations of $Co_3O_4$ into the crystal structure of a crystalline lithium cobalt oxide composition, and thereby allows the morphology of the composition to be controlled in a more precise manner than was previously possible in the art.

By way of example, and as discussed in more detail below, when the method of production of the crystalline lithium cobalt oxide composition is a physical vapor deposition (PVD) method, it has been surprisingly found that localised concentrations of $Co_3O_4$ can be introduced into the crystal structure of the composition (for example, by changing the cobalt flux relative to the lithium flux, varying the partial pressure of the gases supplied, or shutting off the lithium supply during the deposition) enabling controlling the morphology of the crystalline lithium cobalt oxide composition. The control of one atomic flux relative to another during deposition, and the advantages it confers as regards the morphology of the composition, has not been previously disclosed in the art.

Similarly, during the deposition of other layered mixed metal oxides (such as $Li_xMn_{1-y}M_yO_2$) through a physical vapour deposition method comprising deposition of the component elements, it is envisaged that a change in the relative fluxes of the component elements (for example, by changing the manganese flux relative to the lithium flux, varying the partial pressure of the gases supplied, or shutting off the lithium supply during the deposition) will result in the formation of a distinct lithium-depleted phase that has a different crystal structure to the layered oxide.

As will be apparent to the person skilled in the art, the presence of this distinct phase will allow the morphology of the layered oxide to be modified, in line with the effect observed when $Co_3O_4$ is introduced into lithium cobalt oxide.

It has also been surprisingly found by the present inventors that crystalline lithium cobalt oxide compositions having the crystal orientations described herein, which are typically less uniform and rougher in nature, exhibit better electrochemical behaviour in solid-state batteries with respect to both capacity and cycle life (particularly although not exclusively when cycled with 100% depth of discharge and/or when cycled at a temperature of 25° C.) compared with films of the same composition which have crystal orientations that are flat and smooth. While the prior art may teach application of films of lithium cobalt oxide compositions having similar morphology in batteries using liquid electrolytes, the application of lithium cobalt oxide films having the specified morphologies in batteries using a solid electrolyte, and the improved properties (cycle life, capacity, adhesion to the underlying layers and control of stresses, less cracking) when used with solid electrolytes has not been previously disclosed in the art.

In particular, and in contrast to what is disclosed in WO 2015/104539, which teaches the formation of a lithium cobalt oxide having a smooth surface morphology, it has been surprisingly found that the less uniform, rougher morphology of the lithium cobalt oxide compositions, exhibit better electrochemical behaviour in solid-state batteries with respect to both capacity and cycle life, improved adhesion to the current collector and/or electrolyte layers, and less cracking, compared with films of the same composition which have crystal orientations that are flat and smooth.

There are further advantages of using the method of the invention to tune the film morphology and control the roughness of the film surface. In solid-state batteries it can be advantageous to introduce enough disorder in the film to enhance the Li-transport properties (increased capacity and cycle life) while keeping the film smooth enough to allow for only a thin layer of solid electrolyte to be required to cover the lithium cobalt oxide film. The methods of the invention also make the film morphology less dependent on the substrate used. Furthermore, the methods of the invention may allow lithium cobalt oxide of the desired orientation to be grown at lower temperatures. Finally, depositing $Co_3O_4$ as a seeding layer means that no additional sources are required during the deposition process.

As will be apparent to the person skilled in the art, the presence of a distinct, lithium-depleted phase will produce analogous effects in other layered oxide materials having the same crystal structure as lithium cobalt oxide.

DETAILED DESCRIPTION

Definitions

As used herein, ranges of values set forth herein as "X to Y" or "between X and Y" are inclusive of the end values X and Y.

As used herein, the term "battery" is taken to be synonymous with the term "cell", and is a device capable of either generating electrical energy from chemical reactions or facilitating chemical reactions through the introduction of electrical energy.

As used herein, the term "crystalline" means a solid that has a regular internal arrangement of atoms, ions or molecules characteristic of crystals, i.e. that has a long range order in its lattice.

As used herein, the term "layered oxide" refers generally to a layered mixed metal oxide having a rocksalt structure belonging to the R-3m space group, the oxide comprising lithium and one or more transition metals selected from the group consisting of chromium, manganese, iron, nickel, cobalt, and combinations thereof.

As used herein, the term "crystalline oxide" means the crystalline lithium cobalt oxide or crystalline doped lithium cobalt oxide component of the composition described herein in relation to certain embodiments of the invention (as opposed to the whole composition which also includes $Co_3O_4$). In one embodiment the term "crystalline oxide" means a crystalline lithium cobalt oxide, i.e. it contains only lithium, cobalt and oxygen. In another embodiment, the term "crystalline oxide" means a doped crystalline doped lithium cobalt oxide, i.e. which also contains at least one dopant element (selected from those listed herein) in addition to lithium, cobalt and oxygen.

Composition

In certain embodiments, the invention provides a composition comprising $Co_3O_4$ and a crystalline oxide of lithium and cobalt (as defined herein) or crystalline doped lithium cobalt oxide (as defined herein). In one embodiment, the invention provides a composition consisting essentially of $Co_3O_4$ and a crystalline oxide of lithium and cobalt). In one embodiment, the invention provides a composition consisting of $Co_3O_4$ and a crystalline oxide of lithium and cobalt.

In the composition of the invention, in one embodiment the composition has a solid-state structure that includes both $Co_3O_4$ and the crystalline oxide. In one embodiment both $Co_3O_4$ and the crystalline oxide are incorporated into the solid-state structure of the composition. In one embodiment $Co_3O_4$ is present on a surface of the solid-state structure of the composition. In another embodiment $Co_3O_4$ is incorporated into the solid-state structure of the composition as a layer 1-50 nm thick.

In another embodiment $Co_3O_4$ is incorporated into the solid-state structure of the composition as a seed layer.

The composition of certain embodiments of the invention comprises a crystalline oxide of lithium and cobalt (as defined herein) or crystalline doped lithium cobalt oxide (as defined herein). In one embodiment, at least 90% by mass of the total mass of the lithium cobalt oxide or doped lithium cobalt oxide is crystalline. In one embodiment, at least 95% by mass of the total mass of the lithium cobalt oxide or doped lithium cobalt oxide is crystalline. In one embodiment, at least 97% by mass of the total mass of the lithium cobalt oxide or doped lithium cobalt oxide is crystalline.

In one embodiment, at least 98% by mass of the total mass of the lithium cobalt oxide or doped lithium cobalt oxide is crystalline. In one embodiment, at least 99% by mass of the total mass of the lithium cobalt oxide or doped lithium cobalt oxide is crystalline. In one embodiment, at least 99.5% by mass of the total mass of the lithium cobalt oxide or doped lithium cobalt oxide is crystalline. In one embodiment, at least 99.7% by mass of the total mass of the lithium cobalt oxide or doped lithium cobalt oxide is crystalline.

In one embodiment, at least 99.8% by mass of the total mass of the lithium cobalt oxide or doped lithium cobalt oxide is crystalline. In one embodiment, at least 99.9% by mass of the total mass of the lithium cobalt oxide or doped lithium cobalt oxide is crystalline. In one embodiment, at least 99.95% by mass of the total mass of the lithium cobalt oxide or doped lithium cobalt oxide is crystalline. In one embodiment, 100% by mass of the total mass of the lithium cobalt oxide or doped lithium cobalt oxide is crystalline.

As is known to the person skilled in the art, crystalline lithium cobalt oxide may comprise a high temperature phase, a low temperature phase, or a mixture thereof. As described by Gummow et al. *Material Research Bulletin*, 1992, 27, 327-337, the high temperature phase of $LiCoO_2$ that is synthesised at a higher temperature (typically 700° C. or above, preferably 800 to 1000° C., more preferably about 900° C.) contains $Li^+$ and $Co^{3+}$ ions in discrete layers between planes of close-packed oxygen ions. In contrast, the low temperature phase of $LiCoO_2$ that is synthesised at a lower temperature (typically 500° C. or below, preferably 300 to 500° C., more preferably about 350 to 450° C., most preferably about 400° C.) has approximately 6% cobalt within the lithium layers.

In one embodiment, the crystalline lithium cobalt oxide contains at least 40% of the high temperature phase, by mass of the total mass of crystalline lithium cobalt oxide. In one embodiment, the crystalline lithium cobalt oxide contains at least 50% of the high temperature phase, by mass of the total mass of crystalline lithium cobalt oxide. In one embodiment, the crystalline lithium cobalt oxide contains at least 60% of the high temperature phase, by mass of the total mass of crystalline lithium cobalt oxide. In one embodiment, the crystalline lithium cobalt oxide contains at least 70% of the high temperature phase, by mass of the total mass of crystalline lithium cobalt oxide. In one embodiment, the crystalline lithium cobalt oxide contains at least 80% of the high temperature phase, by mass of the total mass of crystalline lithium cobalt oxide. In one embodiment, the crystalline lithium cobalt oxide contains at least 85% of the high temperature phase, by mass of the total mass of crystalline lithium cobalt oxide. In one embodiment, the crystalline lithium cobalt oxide contains at least 90% of the high temperature phase, by mass of the total mass of crystalline lithium cobalt oxide. In one embodiment, the crystalline lithium cobalt oxide contains at least 95% of the high temperature phase, by mass of the total mass of crystalline lithium cobalt oxide. In one embodiment, the crystalline lithium cobalt oxide contains at least 97% of the high temperature phase, by mass of the total mass of crystalline lithium cobalt oxide. In one embodiment, the crystalline lithium cobalt oxide contains at least 98% of the high temperature phase, by mass of the total mass of crystalline lithium cobalt oxide. In one embodiment, the crystalline lithium cobalt oxide contains at least 99% of the high temperature phase, by mass of the total mass of crystalline lithium cobalt oxide. In one embodiment, the crystalline lithium cobalt oxide contains at least 99.5% of the high temperature phase, by mass of the total mass of crystalline lithium cobalt oxide. In one embodiment, the crystalline lithium cobalt oxide contains at least 99.7% of the high temperature phase, by mass of the total mass of crystalline lithium cobalt oxide. In one embodiment, the crystalline lithium cobalt oxide contains at least 99.9% of the high temperature phase, by mass of the total mass of crystalline lithium cobalt oxide. In one embodiment, the crystalline lithium cobalt oxide contains 100% of the high temperature phase, by mass of the total mass of crystalline lithium cobalt oxide.

In one embodiment, the crystalline lithium cobalt oxide contains up to 60% of the low temperature phase, by mass of the total mass of crystalline lithium cobalt oxide. In one embodiment, the crystalline lithium cobalt oxide contains up to 50% of the low temperature phase, by mass of the total mass of crystalline lithium cobalt oxide. In one embodiment, the crystalline lithium cobalt oxide contains up to 40% of the low temperature phase, by mass of the total mass of crystalline lithium cobalt oxide.

In one embodiment, the crystalline lithium cobalt oxide contains up to 30% of the low temperature phase, by mass of the total mass of crystalline lithium cobalt oxide. In one embodiment, the crystalline lithium cobalt oxide contains up to 20% of the low temperature phase, by mass of the total mass of crystalline lithium cobalt oxide. In one embodiment, the crystalline lithium cobalt oxide contains up to 15% of the low temperature phase, by mass of the total mass of crystalline lithium cobalt oxide. In one embodiment, the crystalline lithium cobalt oxide contains up to 10% of the low temperature phase, by mass of the total mass of crystalline lithium cobalt oxide. In one embodiment, the crystalline lithium cobalt oxide contains up to 5% of the low temperature phase, by mass of the total mass of crystalline lithium cobalt oxide. In one embodiment, the crystalline lithium cobalt oxide contains up to 3% of the low temperature phase, by mass of the total mass of crystalline lithium cobalt oxide. In one embodiment, the crystalline lithium cobalt oxide contains up to 2% of the low temperature phase, by mass of the total mass of crystalline lithium cobalt oxide. In one embodiment, the crystalline lithium cobalt oxide contains up to 1% of the low temperature phase, by mass of the total mass of crystalline lithium cobalt oxide. In one embodiment, the crystalline lithium cobalt oxide contains up to 0.5% of the low temperature phase, by mass of the total mass of crystalline lithium cobalt oxide. In one embodiment, the crystalline lithium cobalt oxide contains up to 0.3% of the low temperature phase, by mass of the total mass of crystalline lithium cobalt oxide. In one embodiment, the crystalline lithium cobalt oxide contains up to 0.1% of the low temperature phase, by mass of the total mass of crystalline lithium cobalt oxide.

In one embodiment, the crystalline lithium cobalt oxide contains 45 to 90% of the high temperature phase and 10% to 55% of the low temperature phase, by mass of the total mass of crystalline lithium cobalt oxide. In one embodiment, the crystalline lithium cobalt oxide contains 60 to 95% of the high temperature phase and 5% to 40% of the low temperature phase, by mass of the total mass of crystalline lithium cobalt oxide. The relative amounts of low temperature and high temperature phase of crystalline lithium cobalt oxide can be estimated using a Raman fitting technique similar to that described by Tintignac *Electrochimica Acta*, 2012, 60, 121-129.

Typically, the majority of the cobalt present in the composition is in an oxidation state of +3, such that the stoichiometry of the lithium cobalt oxide is generally expressed as $LiCoO_2$. In certain embodiments the lithium cobalt oxide is deficient in lithium, such that the stoichiometry of the lithium cobalt oxide is $Li_xCoO_2$ where $0<x<1$. In certain embodiments the lithium cobalt oxide contains a greater proportion of lithium and/or at least some of the cobalt present in the composition is in an oxidation state of +2, such that that the stoichiometry of the lithium cobalt oxide is $Li_xCoO_2$ where $1<x\leq 2$.

The crystalline oxide according to certain embodiments of the invention comprises 45 to 55 atomic % lithium, expressed as a percentage of the total atoms in the crystalline oxide excluding oxygen. In one embodiment, the crystalline oxide comprises 46 to 54 atomic % lithium, expressed as a percentage of the total atoms in the crystalline oxide excluding oxygen. In one embodiment, the crystalline oxide comprises 47 to 53 atomic % lithium, expressed as a percentage of the total atoms in the composition excluding oxygen. In one embodiment, the crystalline oxide comprises 47.0 to 53.0 atomic % lithium, expressed as a percentage of the total atoms in the crystalline oxide excluding oxygen. In one embodiment, the crystalline oxide comprises 47.1 to 52.0 atomic % lithium, expressed as a percentage of the total atoms in the crystalline oxide excluding oxygen. In one embodiment, the crystalline oxide comprises 47.2 to 51.0 atomic % lithium, expressed as a percentage of the total atoms in the crystalline oxide excluding oxygen. In one embodiment, the crystalline oxide comprises 47.3 to 50.0 atomic % lithium, expressed as a percentage of the total atoms in the crystalline oxide excluding oxygen. In one embodiment, the crystalline oxide comprises 47.4 to 49.5 atomic % lithium, expressed as a percentage of the total atoms in the crystalline oxide excluding oxygen. In one embodiment, the crystalline oxide comprises 47.5 to 49.1 atomic % lithium, expressed as a percentage of the total atoms in the crystalline oxide excluding oxygen.

The crystalline oxide according to certain embodiments of the invention comprises 20 to 55 atomic % cobalt, expressed as a percentage of the total atoms in the crystalline oxide excluding oxygen. In one embodiment, the crystalline oxide comprises 22.5 to 55 atomic % cobalt, expressed as a percentage of the total atoms in the crystalline oxide excluding oxygen. In one embodiment, the crystalline oxide comprises 25 to 55 atomic % cobalt, expressed as a percentage of the total atoms in the composition excluding oxygen. In one embodiment, the crystalline oxide comprises 27.5 to 55 atomic % cobalt, expressed as a percentage of the total atoms in the crystalline oxide excluding oxygen. In one embodiment, the composition comprises 30 to 55 atomic % cobalt, expressed as a percentage of the total atoms in the crystalline oxide excluding oxygen. In one embodiment, the composition comprises 32.5 to 55 atomic % cobalt, expressed as a percentage of the total atoms in the crystalline oxide excluding oxygen. In one embodiment, the composition comprises 35 to 55 atomic % cobalt, expressed as a percentage of the total atoms in the crystalline oxide excluding oxygen. In one embodiment, the crystalline oxide comprises 37.5 to 55 atomic % cobalt, expressed as a percentage of the total atoms in the crystalline oxide excluding oxygen. In one embodiment, the crystalline oxide comprises 40 to 55 atomic % cobalt, expressed as a percentage of the total atoms in the crystalline oxide excluding oxygen. In one embodiment, the composition comprises 42.5 to 55 atomic % cobalt, expressed as a percentage of the total atoms in the crystalline oxide excluding oxygen. In one embodiment, the crystalline oxide comprises 45 to 55 atomic % cobalt, expressed as a percentage of the total atoms in the crystalline oxide excluding oxygen. In one embodiment, the crystalline oxide comprises 46 to 54 atomic % cobalt, expressed as a percentage of the total atoms in the crystalline oxide excluding oxygen. In one embodiment, the crystalline oxide comprises 46.5 to 53.5 atomic % cobalt, expressed as a percentage of the total atoms in the crystalline oxide excluding oxygen. In one embodiment, the crystalline oxide comprises 47.0 to 53 atomic % cobalt, expressed as a percentage of the total atoms in the crystalline oxide excluding oxygen. In one embodiment, the crystalline oxide comprises 49.0 to 52.8 atomic % cobalt, expressed as a percentage of the total atoms in the crystalline oxide excluding oxygen. In one embodiment, the crystalline oxide comprises 50.0 to 52.7 atomic % cobalt, expressed as a percentage of the total atoms in the crystalline oxide excluding oxygen. In one embodiment, the crystalline oxide comprises 50.5 to 52.6 atomic % cobalt, expressed as a percentage of the total atoms in the crystalline oxide excluding oxygen. In one embodiment, the crystalline oxide comprises 50.5 to 52.5 atomic % cobalt, expressed as a percentage of the total atoms in the crystalline oxide excluding oxygen. In one embodiment, the crystalline oxide comprises 50.9 to 52.5 atomic % cobalt, expressed as a percentage of the total atoms in the crystalline oxide excluding oxygen.

The crystalline oxide may also include dopant elements, in addition to lithium and cobalt. In this specification the term "doped crystalline oxide" means a crystalline oxide of lithium and cobalt in which other elements (hereinafter "dopant elements") may substitute for lithium, cobalt or oxygen in the crystalline structure. In one embodiment such dopant elements substitute for lithium. In one embodiment such elements substitute for cobalt. In one embodiment such dopant elements substitute for lithium and cobalt. In one embodiment such dopant elements substitute for oxygen.

Examples of dopant elements which may substitute for lithium include sodium and potassium. Examples of dopant elements which may substitute for oxygen include sulphur and selenium.

In one embodiment, the dopant element which substitutes for cobalt is divalent (in other words, in a +2 oxidation state). In one embodiment, the dopant element which substitutes for cobalt is trivalent (in other words, in a +3 oxidation state). In one embodiment, the dopant element which substitutes for cobalt is tetravalent (in other words, in a +4 oxidation state).

Examples of dopant elements which may substitute for cobalt include alkaline earth metals (such as magnesium, calcium and strontium), transition metals (such as titanium, zirconium, vanadium, chromium, manganese, iron, copper, ruthenium, nickel, molybdenum and zinc), p-block elements (such as boron, aluminium, gallium, tin, lead and bismuth) and lanthanides (such as lanthanum, cerium, gadolinium and europium).

Typically, the dopant element which substitutes for cobalt, where present, may be present in an amount of up to 25%, such as up to 20%, such as up to 15%, such as up to 12.5%, such as up to 10%, such as up to 7.5%, such as up to 5%, such as up to 4%, such as up to 3%, such as up to 2%, such as up to 1.5%, such as up to 1%, such as up to 0.9%, such as up to 0.8%, such as up to 0.7%, such as up to 0.6%, such as up to 0.5%, such as up to 0.4%, such as up to 0.3%, such as up to 0.2%, such as up to 0.15%, such as up to 0.1%, such as up to 0.09%, such as up to 0.08%, such as up to 0.07%, such as up to 0.06%, such as up to 0.05%, such as up to 0.04%, such as up to 0.03%, such as up to 0.02%, such as up to 0.01%, such as up to 0.009%, such as up to 0.008%, such as up to 0.007%, such as up to 0.006%, such as up to 0.005%, such as up to 0.004%, such as up to 0.003%, such as up to 0.002%, such as up to 0.001%, expressed as a percentage of the total atoms in the doped crystalline oxide excluding oxygen.

In one embodiment, the doped crystalline oxide comprises 0 to 25 atomic % of at least one dopant element selected from the group consisting of: magnesium, calcium, strontium, titanium, zirconium, vanadium, chromium, manganese, iron, copper, ruthenium, nickel, molybdenum, zinc, boron, aluminium, gallium, tin, lead, bismuth, lanthanum, cerium, gadolinium and europium, the amount expressed as a percentage of the total atoms in the doped crystalline oxide excluding oxygen. In one embodiment, the doped crystalline oxide comprises 0 to 20 atomic % of at least one dopant element selected from the group consisting of: magnesium, calcium, strontium, titanium, zirconium, vanadium, chromium, manganese, iron, copper, ruthenium, nickel, molybdenum, zinc, boron, aluminium, gallium, tin, lead, bismuth, lanthanum, cerium, gadolinium and europium, the amount expressed as a percentage of the total atoms in the doped crystalline oxide excluding oxygen. In one embodiment, the doped crystalline oxide comprises 0 to 15 atomic % of at least one dopant element selected from the group consisting of: magnesium, calcium, strontium, titanium, zirconium, vanadium, chromium, manganese, iron, copper, ruthenium, nickel, molybdenum, zinc, boron, aluminium, gallium, tin, lead, bismuth, lanthanum, cerium, gadolinium and europium, the amount expressed as a percentage of the total atoms in the doped crystalline oxide excluding oxygen. In one embodiment, the doped crystalline oxide comprises 0 to 10 atomic % of at least one dopant element selected from the group consisting of: magnesium, calcium, strontium, titanium, zirconium, vanadium, chromium, manganese, iron, copper, ruthenium, nickel, molybdenum, zinc, boron, aluminium, gallium, tin, lead, bismuth, lanthanum, cerium, gadolinium and europium, the amount expressed as a percentage of the total atoms in the doped crystalline oxide excluding oxygen. In one embodiment, the doped crystalline oxide comprises 0 to 5 atomic % of at least one dopant element selected from the group consisting of: magnesium, calcium, strontium, titanium, zirconium, vanadium, chromium, manganese, iron, copper, ruthenium, nickel, molybdenum, zinc, boron, aluminium, gallium, tin, lead, bismuth, lanthanum, cerium, gadolinium and europium, the amount expressed as a percentage of the total atoms in the doped crystalline oxide excluding oxygen. In one embodiment, the doped crystalline oxide comprises 0 to 2.5 atomic % of at least one dopant element selected from the group consisting of: magnesium, calcium, strontium, titanium, zirconium, vanadium, chromium, manganese, iron, copper, ruthenium, nickel, molybdenum, zinc, boron, aluminium, gallium, tin, lead, bismuth, lanthanum, cerium, gadolinium and europium, the amount expressed as a percentage of the total atoms in the doped crystalline oxide excluding oxygen. In one embodiment, the doped crystalline oxide comprises 0 to 2 atomic % of at least one element selected from the group consisting of: magnesium, calcium, strontium, titanium, zirconium, vanadium, chromium, manganese, iron, copper, ruthenium, nickel, molybdenum, zinc, boron, aluminium, gallium, tin, lead, bismuth, lanthanum, cerium, gadolinium and europium, the amount expressed as a percentage of the total atoms in the doped crystalline oxide excluding oxygen. In one embodiment, the doped crystalline oxide comprises 0 to 1.5 atomic % of at least one element selected from the group consisting of: magnesium, calcium, strontium, titanium, zirconium, vanadium, chromium, manganese, iron, copper, ruthenium, nickel, molybdenum, zinc, boron, aluminium, gallium, tin, lead, bismuth, lanthanum, cerium, gadolinium and europium, the amount expressed as a percentage of the total atoms in the doped crystalline oxide excluding oxygen. In one embodiment, the doped crystalline oxide comprises 0 to 1 atomic % of at least one element selected from the group consisting of: magnesium, calcium, strontium, titanium, zirconium, vanadium, chromium, manganese, iron, copper, ruthenium, nickel, molybdenum, zinc, boron, aluminium, gallium, tin, lead, bismuth, lanthanum, cerium, gadolinium and europium, the amount expressed as a percentage of the total atoms in the doped crystalline oxide excluding oxygen. In one embodiment, the doped crystalline oxide comprises 0 to 0.5 atomic % of at least one element selected from the group consisting of: magnesium, calcium, strontium, titanium, zirconium, vanadium, chromium, manganese, iron, copper, ruthenium, nickel, molybdenum, zinc, boron, aluminium, gallium, tin, lead, bismuth, lanthanum, cerium, gadolinium and europium, the amount expressed as a percentage of the total atoms in the doped crystalline oxide excluding oxygen. In one embodiment, there is provided a composition of the invention, the doped crystalline lithium cobalt oxide component having: 45 to 55 atomic % lithium; 40 to 55 atomic % cobalt; and 0 to 5 atomic % of at least one dopant element selected from the group consisting of: magnesium, calcium, strontium, titanium, zirconium, vanadium, chromium, manganese, iron, copper, ruthenium, nickel, molybdenum, zinc, boron, aluminium, gallium, tin, lead, bismuth, lanthanum, cerium, gadolinium and europium; the amounts expressed as % of the total atoms in the doped crystalline lithium cobalt oxide excluding oxygen.

In one embodiment, there is provided a composition of the invention, the doped crystalline lithium cobalt oxide component having: 45 to 55 atomic % lithium; 42.5 to 55 atomic % cobalt; and 0 to 2.5 atomic % of at least one dopant element selected from the group consisting of: magnesium, calcium, strontium, titanium, zirconium, vanadium, chromium, manganese, iron, copper, ruthenium, nickel, molybdenum, zinc, boron, aluminium, gallium, tin, lead, bismuth, lanthanum, cerium, gadolinium and europium; the amounts expressed as % of the total atoms in the doped crystalline lithium cobalt oxide excluding oxygen.

In one embodiment, there is provided a composition of the invention, the crystalline lithium cobalt oxide component consisting of: 45 to 55 atomic % lithium and 45 to 55 atomic % cobalt; the amounts expressed as % of the total atoms in the crystalline oxide excluding oxygen.

In one embodiment, there is provided a composition of the invention, the crystalline lithium cobalt oxide component consisting of: 47.0 to 53.0 atomic % lithium and 47.0 to 53.0 atomic % cobalt; the amounts expressed as % of the total atoms in the crystalline oxide excluding oxygen.

In one embodiment, there is provided a composition of the invention, the crystalline lithium cobalt oxide component consisting of: 47.5 to 49.1 atomic % lithium and 50.9 to 52.5 atomic % cobalt; the amounts expressed as % of the total atoms in the crystalline oxide excluding oxygen.

In addition to lithium, cobalt and (optionally) the dopant elements listed above, the crystalline composition of an embodiment of the present invention also includes oxygen which provides the source of negative ions in the crystalline composition. It can be understood that the composition comprises sufficient oxygen (as oxide ions $O^{2-}$) to ensure it is electrically neutral, the precise amount of oxygen depending on the atomic percentage and oxidation state of the other elements present in the composition.

A distinguishing feature of the composition of an embodiment of the present invention is that the crystalline structure of the composition includes a localized concentration of $Co_3O_4$. Surprisingly, the inventors have found that introducing localized concentrations of $Co_3O_4$ into the crystal structure of a crystalline lithium cobalt oxide composition allows the morphology of the composition to be controlled in a more precise manner than was previously possible in the art. Without wishing to be bound by theory, it is thought that the localized concentration of $Co_3O_4$ may act as a seeding layer for $LiCoO_2$ crystallites. In addition, without wishing to be bound by theory, it is thought that the localized concentration of $Co_3O_4$ creates defects in the crystal structure of lithium cobalt oxides which promote the preferred crystal orientations described herein, resulting in the rough or irregular morphology of the crystal as described herein (comprising, for example, large plate-like grains), and which exhibit improved electrochemical properties compared with lithium cobalt oxide compositions as known in the art.

When the composition is in the form of a film, the film typically exhibits a large crystallite size of between 0.2 and 3.0 µm, preferably 0.3 to 2.5 µm. In one embodiment the film exhibits a large crystallite size of between 0.7 and 2.0 µm. In one embodiment the film exhibits a large crystallite size of between 0.5 and 1.0 µm. In one embodiment the film exhibits a large crystallite size of between 0.4 and 0.9 µm. Typically, the crystallite sizes are measured by hand and/or using a scanning electron microscope (SEM) having an appropriate measurement tool and appropriate hardware and/or software.

In general, the film comprises crystallites having a maximum dimension, in the plane of the film, that is at least 0.2 µm, preferably at least 0.3 µm, in certain embodiments at least 0.4 µm. Typically, the film comprises crystallites having a maximum dimension, in the plane of the film, of up to 3 µm, in certain cases up to 2 µm. When the composition is in the form of a film, the film typically exhibits an average area of larger crystallites of between 0.1 and 2 µm², preferably between 0.2 and 1 µm². In one embodiment, the film exhibits an average area of larger crystallites of 0.8 µm². In one embodiment, the film exhibits an average area of larger crystallites of 0.3 µm². Typically, the average area of larger crystallites are measured using a scanning electron microscope (SEM) having an appropriate measurement tool and appropriate hardware and/or software.

When the composition is in the form of a film, typically 1 to 100%, preferably 3 to 85% of the surface area of the film is covered by larger crystallites. In one embodiment 70 to 90%, such as 75 to 85%, such as 79%, of the surface area of the film is covered by larger crystallites. In one embodiment 15 to 35%, such as 20 to 25%, such as 22%, of the surface area of the film is covered by larger crystallites. In one embodiment 1 to 10%, preferably 3 to 6%, such as 4.5 to 5.4%, such as 5% of the surface area of the film is covered by larger crystallites. Typically, the proportion of the film covered by larger crystallites is measured using a scanning electron microscope (SEM) using the area and the number of larger crystallites within the image area using appropriate hardware and/or software.

The term "crystallite" is used herein to denote a region of the film within which the orientation of the crystal lattice remains substantially constant. Thus, the boundary between adjacent crystallites is typically indicated by a change in lattice orientation. A single crystallite may include multiple sub-crystallites, all having crystal lattices of substantially the same orientation. Typically, an individual sub-crystallite grows through seeding on an adjacent sub-crystallite, such that the lattice orientations of the two sub-crystallites are substantially aligned. In certain cases, a crystallite, as defined herein, may be referred to in the art as a "grain".

The roughness of the surface may be measured using a technique such as stylus profilometry to determine the average roughness $R_a$, which is the arithmetic average value of filtered roughness profile determined from deviations about the centre line within the evaluation length. When the composition is in the form of a film, typically the average surface roughness ($R_a$) of the film is between 10 and 200 nm, such as 20 to 150 nm, such as 40 to 120 nm. The average surface roughness ($R_a$) of the film may be at least 10 nm, in certain cases at least 30 nm, in certain cases at least 50 nm. In certain cases, the average surface roughness ($R_a$) of the film may be up to 250 nm. In contrast, films having the smooth surfaces of the crystal having predominantly (003) orientation, which is generally undesirable for the purpose of the present invention, have an average surface roughness $R_a$ of less than 10 nm, such as 4 nm. Typically, the average roughness is measured using a stylus profilometer, the figure $R_a$ denoting the average roughness (average deviation from the mean). Typically, the average $R_a$ is calculated from three different measurements a few millimetres apart, each scan typically being 2 mm long.

In the embodiments where the composition takes the form of a film, the localised concentration of $Co_3O_4$ may be present in an amount to facilitate the desired structure of the resulting crystalline film.

In the composition of an embodiment of the invention, 0.01% to 10% of the total mass of said composition is $Co_3O_4$. In one embodiment, 0.01% to 5% total mass of said composition is $Co_3O_4$. In one embodiment, 5% to 7.5% total mass of said composition is $Co_3O_4$. In one embodiment, 7.5% to 10% total mass of said composition is $Co_3O_4$. In one embodiment, 0.01% to 0.05% total mass of said composition is $Co_3O_4$. In one embodiment, 0.05% to 0.1% total mass of said composition is $Co_3O_4$. In one embodiment, 0.1% to 0.5% total mass of said composition is $Co_3O_4$. In one embodiment, 0.5% to 1.0% total mass of said composition is $Co_3O_4$. In one embodiment, 1.0% to 1.5% total mass of said composition is $Co_3O_4$. In one embodiment, 1.5% to 2.0% total mass of said composition is $Co_3O_4$. In one embodiment, 2.0% to 3.0% total mass of said composition is $Co_3O_4$. In one embodiment, 3.0% to 4.0% total mass of said composition is $Co_3O_4$. In one embodiment, 4.0% to 5.0% total mass of said composition is $Co_3O_4$. The total mass expressed includes all elements including oxygen.

In one embodiment, the composition is non-homogeneous with regard to the distribution of $Co_3O_4$ within the composition.

Typically, the composition is formed in the form of a film layer, especially a film layer on a substrate (as defined in more detail below). In one embodiment, said composition is a thin-film layer comprising a top surface, a bottom surface, and a height of 1-50 µm. In one embodiment, the height of the layer is from 1 to 30 µm. In one embodiment, the height of the layer is from 2 to 20 µm. In one embodiment, the height of the layer is from 3 to 12 µm. In one embodiment, the height of the layer is from 5 to 10 µm. In one embodiment, the height of the layer is from 6 to 7 µm.

In one embodiment, the crystalline oxide thin-film layer comprises a seed layer of $Co_3O_4$. In one embodiment, said seed layer is within 75% of the height from the bottom surface. In one embodiment, said seed layer is within 50% of the height from the bottom surface. In one embodiment, said seed layer is within 25% of the height from the bottom surface. In one embodiment, said seed layer is within 10% of the height from the bottom surface. In one embodiment, said seed layer is within 5% of the height from the bottom surface. In one embodiment, said seed layer is within 2.5% of the height from the bottom surface. In one embodiment, said seed layer comprises the bottom surface of the thin-film layer.

In one embodiment, said seed layer is 0.1-100 nm thick. In one embodiment, said seed layer is 0.1-50 nm thick. In one embodiment, said seed layer is 0.1-25 nm thick. In one embodiment, said seed layer is 0.1-10 nm thick. In one embodiment, said seed layer is 1-50 nm thick. In one embodiment, said seed layer is 1-25 nm thick. In one embodiment, said seed layer is 1-10 nm thick. In one embodiment, said seed layer is 1-5 nm thick.

In one embodiment, the localized concentration of $Co_3O_4$ may be defined in terms of the thickness of an effective layer of $Co_3O_4$. In this specification, by "effective layer" is meant that if all of the $Co_3O_4$ present in the localized concentration were, hypothetically, to be distributed evenly throughout the bulk of the composition as a layer. The thickness of the effective layer, compared with the thickness of the crystalline oxide component of the composition, can be used as an estimation of the amount of the $Co_3O_4$ present in the localized concentration.

In one embodiment, the thickness of the crystalline lithium cobalt oxide composition is from 1 to 50 μm and the thickness of the effective $Co_3O_4$ layer is from 0.1 to 5 μm. In one embodiment, the thickness of the crystalline lithium cobalt oxide composition is from 2 to 20 μm and the thickness of the effective $Co_3O_4$ layer is from 0.2 to 500 nm.

A further distinguishing feature of the lithium cobalt oxide composition of an embodiment of the present invention is its crystalline structure. As indicated above, the present inventors have surprisingly found that crystalline lithium cobalt oxide compositions having the morphology described herein are typically less uniform and rougher in nature than the crystalline lithium cobalt oxides used in solid-state batteries according to the prior art, and exhibit more favourable electrochemical behaviour in such solid-state batteries with respect to both capacity and cycle life compared with films of the same composition which have crystal orientations that are flat and smooth.

In one embodiment, the crystalline structure of the lithium cobalt oxide composition or doped lithium cobalt oxide composition may be defined in terms of the Miller indices of the crystal lattice planes. As is known to the person skilled in the art, the Miller indices form a notation system in crystallography for planes in crystal (Bravais) lattices. In particular, a family of lattice planes is determined by three integers h, k, and ℓ, the Miller indices. They are written (hkℓ), and denote the family of planes orthogonal to $hb_1 + kb_2 + ℓb_3$, where $b_i$ are the basis of the reciprocal lattice vectors. The integers are usually written in lowest terms, i.e. their greatest common divisor should be 1.

In one embodiment, at least a portion of the crystalline structure of the crystalline oxide, i.e. the crystalline lithium cobalt oxide composition, crystalline doped lithium cobalt oxide, has an orientation having a Miller index selected from the group consisting of: (101), (104), (110) and (012), or a mixture of any thereof. In one embodiment, at least a portion of the crystalline structure of the crystalline oxide composition has an orientation having a Miller index selected from the group consisting of: (101), (104) or both.

In the composition of an embodiment of the present invention, the crystal orientation of the crystalline structure of the crystalline oxide may be defined by reference to a plane parallel to the bottom surface of the composition. Therefore, in one embodiment, at least a portion of the crystalline structure of the crystalline oxide has a crystal orientation, relative to a plane parallel to the bottom surface, selected from the group consisting of: (101), (104), (110) and (012), or a mixture of any thereof. In one embodiment, at least a portion of the crystalline structure of the crystalline oxide composition has an orientation, relative to a plane parallel to the bottom surface, selected from the group consisting of: (101), (104) or both.

Alternatively, in the composition of an embodiment of the present invention, the crystal orientation of the crystalline structure of the crystalline oxide may be defined by reference to at least one lattice plane parallel to the bottom surface of the composition. In one embodiment the lattice plane defined by the Miller index h is parallel to the bottom surface of the composition. In one embodiment the lattice plane defined by the Miller index k is parallel to the bottom surface of the composition. In one embodiment the lattice plane defined by the Miller index ℓ is parallel to the bottom surface of the composition.

Therefore, in one embodiment, at least a portion of the crystalline structure of the crystalline oxide has a crystal orientation, relative to a plane parallel to the bottom surface, selected from the group consisting of: (101), (104), (110) and (012), or a mixture of any thereof. In one embodiment, at least a portion of the crystalline structure of the crystalline oxide composition has an orientation, relative to a plane parallel to the bottom surface, selected from the group consisting of: (101), (104) or both.

Alternatively, in the composition of an embodiment of the present invention, the crystal orientation of the crystalline structure of the crystalline oxide may be defined by reference to a plane perpendicular to the direction of growth of the crystal. Therefore, in one embodiment, at least a portion of the crystalline structure of the crystalline oxide has a crystal orientation, relative to a plane perpendicular to the direction of growth of the crystal, selected from the group consisting of: (101), (104), (110) and (012), or a mixture of any thereof. In one embodiment, at least a portion of the crystalline structure of the crystalline oxide composition has an orientation, relative to a plane perpendicular to the direction of growth of the crystal, selected from the group consisting of: (101), (104) or both.

Alternatively, when the composition of an embodiment of the present invention is present in a lithium-ion battery, the crystal orientation of the crystalline structure of the crystalline oxide may be defined by reference to a plane perpendicular to the direction of the lithium-ion pathway through the battery. Therefore, in one embodiment, the composition of the present invention is present in a lithium-ion battery and at least a portion of the crystalline structure of the crystalline oxide has a crystal orientation, relative to a plane perpendicular to the direction of the lithium-ion pathway through the battery, selected from the group consisting of: (101), (104), (110) and (012), or a mixture of any thereof. In one embodiment, at least a portion of the crystalline structure of the crystalline oxide composition has an orientation, relative to a plane perpendicular to the direction of the lithium-ion pathway through the battery, selected from the group consisting of: (101), (104) or both.

Alternatively, when the composition of an embodiment of the present invention is formed on a substrate, the crystal orientation of the crystalline structure of the crystalline oxide may be defined by reference to a plane parallel to the substrate. Therefore, in one embodiment, at least a portion of the crystalline structure of the crystalline oxide has a crystal orientation, relative to a plane parallel to the substrate, selected from the group consisting of: (101), (104), (110) and (012), or a mixture of any thereof. In one embodiment, at least a portion of the crystalline structure of the crystalline oxide composition has an orientation, relative to a plane parallel to the substrate, selected from the group consisting of: (101), (104) or both.

In one embodiment, at least a portion of the crystalline structure of the crystalline oxide component of the composition has an orientation having the Miller index (101) (the orientations optionally being defined by reference to any of the definitions above). In one embodiment, at least 0.01% by mass of the crystalline structure of the crystalline oxide is in the (101) orientation. In one embodiment, at least 0.02% by mass of the crystalline structure of the crystalline oxide is in the (101) orientation. In one embodiment, at least 0.05% by mass of the crystalline structure of the crystalline oxide is in the (101) orientation. In one embodiment, at least 0.1% by mass of the crystalline structure of the crystalline oxide is in the (101) orientation. In one embodiment, at least 0.2% by mass of the crystalline structure of the crystalline oxide is in the (101) orientation. In one embodiment, at least 0.5% by mass of the crystalline structure of the crystalline oxide is in the (101) orientation. In one embodiment, at least 1% by mass of the crystalline structure of the crystalline oxide is in the (101) orientation. In one embodiment, at least 2% by mass of the crystalline structure of the crystalline oxide is in the (101) orientation. In one embodiment, at least 5% by mass of the crystalline structure of the crystalline oxide is in the (101) orientation. In one embodiment, at least 10% by mass of the crystalline structure of the crystalline oxide is in the (101) orientation. In one embodiment, at least 20% by mass of the crystalline structure of the crystalline oxide is in the (101) orientation. In one embodiment, at least 30% by mass of the crystalline structure of the crystalline oxide is in the (101) orientation. In one embodiment, at least 40% by mass of the crystalline structure of the crystalline oxide is in the (101) orientation. In one embodiment, at least 50% by mass of the crystalline structure of the crystalline oxide is in the (101) orientation. In one embodiment, at least 60% by mass of the crystalline structure of the crystalline oxide is in the (101) orientation. In one embodiment, at least 30% by mass of the crystalline structure of the crystalline oxide is in the (101) orientation. In one embodiment, at least 70% by mass of the crystalline structure of the crystalline oxide is in the (101) orientation. In one embodiment, at least 30% by mass of the crystalline structure of the crystalline oxide is in the (101) orientation. In one embodiment, at least 80% by mass of the crystalline structure of the crystalline oxide is in the (101) orientation. In one embodiment, at least 30% by mass of the crystalline structure of the crystalline oxide is in the (101) orientation. In one embodiment, at least 90% by mass of the crystalline structure of the crystalline oxide is in the (101) orientation. In one embodiment, at least 30% by mass of the crystalline structure of the crystalline oxide is in the (101) orientation. In one embodiment, at least 95% by mass of the crystalline structure of the crystalline oxide is in the (101) orientation. In one embodiment, at least 96% by mass of the crystalline structure of the crystalline oxide composition is in the (101) orientation. In one embodiment, at least 97% by mass of the crystalline structure of crystalline oxide is in the (101) orientation. In one embodiment, at least 98% by mass of the crystalline structure of the crystalline oxide is in the (101) orientation. In one embodiment, at least 99% by mass of the crystalline structure of the lithium cobalt oxide composition is in the (101) orientation. In one embodiment, at least 99.5% by mass of the crystalline structure of the crystalline oxide is in the (101) orientation. In one embodiment, at least 99.7% by mass of the crystalline structure of the crystalline oxide composition is in the (101) orientation. In one embodiment, at least 99.9% by mass of the crystalline structure of the crystalline oxide composition is in the (101) orientation. These percentages are expressed by mass of the total mass of the crystalline composition (i.e. in all crystal orientations present).

In one embodiment, at least a portion of the crystalline structure of the crystalline oxide has an orientation having the Miller index (104) (the orientations optionally being defined by reference to any of the definitions above). In one embodiment, at least 0.01% by mass of the crystalline structure of the crystalline oxide is in the (104) orientation. In one embodiment, at least 0.02% by mass of the crystalline structure of the crystalline oxide is in the (104) orientation. In one embodiment, at least 0.05% by mass of the crystalline structure of the crystalline oxide is in the (104) orientation. In one embodiment, at least 0.1% by mass of the crystalline structure of the crystalline oxide is in the (104) orientation. In one embodiment, at least 0.2% by mass of the crystalline structure of the crystalline oxide is in the (104) orientation. In one embodiment, at least 0.5% by mass of the crystalline structure of the crystalline oxide is in the (104) orientation. In one embodiment, at least 1% by mass of the crystalline structure of the crystalline oxide is in the (104) orientation. In one embodiment, at least 2% by mass of the crystalline structure of the crystalline oxide is in the (104) orientation. In one embodiment, at least 5% by mass of the crystalline structure of the crystalline oxide is in the (104) orientation. In one embodiment, at least 10% by mass of the crystalline structure of the crystalline oxide is in the (104) orientation. In one embodiment, at least 20% by mass of the crystalline structure of the crystalline oxide is in the (104) orientation. In one embodiment, at least 30% by mass of the crystalline structure of the crystalline oxide is in the (104) orientation. In one embodiment, at least 40% by mass of the crystalline structure of the crystalline oxide is in the (104) orientation. In one embodiment, at least 50% by mass of the crystalline structure of the crystalline oxide is in the (104) orientation. In one embodiment, at least 60% by mass of the crystalline structure of the crystalline oxide is in the (104) orientation. In one embodiment, at least 70% by mass of the crystalline structure of the crystalline oxide is in the (104) orientation. In one embodiment, at least 80% by mass of the crystalline structure of the crystalline oxide is in the (104) orientation. In one embodiment, at least 90% by mass of the crystalline structure of the crystalline oxide composition is in the (104) orientation. In one embodiment, at least 95% by mass of the crystalline structure of the crystalline oxide is in the (104) orientation. In one embodiment, at least 96% by mass of the crystalline structure of the crystalline oxide is in the (104) orientation. In one embodiment, at least 97% by mass of the crystalline structure of the crystalline oxide is in the (104) orientation. In one embodiment, at least 98% by mass of the crystalline structure of the crystalline oxide is in the (104) orientation. In one embodiment, at least 99% by mass of the crystalline structure of the crystalline composition is in the (104) orientation. In one embodiment, at least 99.5% by mass of the crystalline structure of the crystalline oxide is in the (104) orientation. In one embodiment, at least 99.7% by mass of the crystalline structure of the crystalline oxide composition is in the (104) orientation. In one embodiment, at least 99.9% by mass of the crystalline structure of the crystalline oxide composition is in the (104) orientation. These percentages are expressed by mass of the total mass of the crystalline oxide (i.e. in all crystal orientations present).

In one embodiment, at least a portion of the crystalline structure of the crystalline oxide composition has an orientation having the Miller index (110) (the orientations optionally being defined by reference to any of the definitions above). In one embodiment, at least 0.01% by mass of the crystalline structure of the crystalline oxide is in the (110) orientation. In one embodiment, at least 0.02% by mass of the crystalline structure of the crystalline oxide is in the (110) orientation. In one embodiment, at least 0.05% by mass of the crystalline structure of the crystalline oxide is in the (110) orientation. In one embodiment, at least 0.1% by mass of the crystalline structure of the crystalline oxide is in the (110) orientation. In one embodiment, at least 0.2% by mass of the crystalline structure of the crystalline oxide is in the (110) orientation. In one embodiment, at least 0.5% by mass of the crystalline structure of the crystalline oxide is in the (110) orientation. In one embodiment, at least 1% by mass of the crystalline structure of the crystalline oxide is in the (110) orientation. In one embodiment, at least 2% by mass of the crystalline structure of the crystalline oxide is in the (110) orientation. In one embodiment, at least 5% by mass of the crystalline structure of the crystalline oxide is in the (110) orientation. In one embodiment, at least 10% by mass of the crystalline structure of the crystalline oxide is in the (110) orientation. In one embodiment, at least 20% by mass of the crystalline structure of the crystalline oxide is in the (110) orientation. In one embodiment, at least 30% by mass of the crystalline structure of the crystalline oxide is in the (110) orientation. In one embodiment, at least 40% by mass of the crystalline structure of the crystalline oxide is in the (110) orientation. In one embodiment, at least 50% by mass of the crystalline structure of the crystalline oxide is in the (110) orientation. In one embodiment, at least 60% by mass of the crystalline structure of the crystalline oxide is in the (110) orientation. In one embodiment, at least 70% by mass of the crystalline structure of the crystalline oxide is in the (110) orientation. In one embodiment, at least 80% by mass of the crystalline structure of the crystalline oxide is in the (110) orientation. In one embodiment, at least 90% by mass of the crystalline structure of the crystalline oxide is in the (110) orientation. In one embodiment, at least 95% by mass of the crystalline structure of the crystalline oxide is in the (110) orientation. In one embodiment, at least 96% by mass of the crystalline structure of the crystalline oxide is in the (110) orientation. In one embodiment, at least 97% by mass of the crystalline structure of the crystalline oxide is in the (110) orientation. In one embodiment, at least 98% by mass of the crystalline structure of the crystalline oxide is in the (110) orientation. In one embodiment, at least 99% by mass of the crystalline structure of the crystalline oxide is in the (110) orientation. In one embodiment, at least 99.5% by mass of the crystalline structure of the crystalline oxide is in the (110) orientation. In one embodiment, at least 99.7% by mass of the crystalline structure of the crystalline oxide is in the (110) orientation. In one embodiment, at least 99.9% by mass of the crystalline structure of the crystalline oxide is in the (110) orientation. These percentages are expressed by mass of the total mass of the crystalline composition (i.e. in all crystal orientations present).

In one embodiment, at least a portion of the crystalline structure of the lithium cobalt oxide composition has an orientation having the Miller index (012) (the orientations optionally being defined by reference to any of the definitions above). In one embodiment, at least 0.01% by mass of the crystalline structure of the crystalline oxide is in the (012) orientation. In one embodiment, at least 0.02% by mass of the crystalline structure of the crystalline oxide is in the (012) orientation. In one embodiment, at least 0.05% by mass of the crystalline structure of the crystalline oxide is in the (012) orientation. In one embodiment, at least 0.1% by mass of the crystalline structure of the crystalline oxide is in the (012) orientation. In one embodiment, at least 0.2% by mass of the crystalline structure of the crystalline oxide is in the (012) orientation. In one embodiment, at least 0.5% by mass of the crystalline structure of the crystalline oxide is in the (012) orientation. In one embodiment, at least 1% by mass of the crystalline structure of the crystalline oxide is in the (012) orientation. In one embodiment, at least 2% by mass of the crystalline structure of the crystalline oxide is in the (012) orientation. In one embodiment, at least 5% by mass of the crystalline structure of the crystalline oxide is in the (012) orientation. In one embodiment, at least 10% by mass of the crystalline structure of the crystalline oxide is in the (012) orientation. In one embodiment, at least 20% by mass of the crystalline structure of the crystalline oxide is in the (012) orientation. In one embodiment, at least 30% by mass of the crystalline structure of the crystalline oxide is in the (012) orientation. In one embodiment, at least 40% by mass of the crystalline structure of the crystalline oxide is in the (012) orientation. In one embodiment, at least 50% by mass of the crystalline structure of the crystalline oxide is in the (012) orientation. In one embodiment, at least 60% by mass of the crystalline structure of the crystalline oxide is in the (012) orientation. In one embodiment, at least 70% by mass of the crystalline structure of the crystalline oxide is in the (012) orientation. In one embodiment, at least 80% by mass of the crystalline structure of the crystalline oxide is in the (012) orientation. In one embodiment, at least 90% by mass of the crystalline structure of the crystalline oxide is in the (012) orientation. In one embodiment, at least 95% by mass of the crystalline structure of the crystalline oxide is in the (012) orientation. In one embodiment, at least 96% by mass of the crystalline structure of the crystalline oxide is in the (012) orientation. In one embodiment, at least 97% by mass of the crystalline structure of the crystalline oxide composition is in the (012) orientation. In one embodiment, at least 98% by mass of the crystalline structure of the crystalline oxide is in the (012) orientation. In one embodiment, at least 99% by mass of the crystalline structure of the crystalline oxide is in the (012) orientation. In one embodiment, at least 99.5% by mass of the crystalline structure of the crystalline oxide is in the (012) orientation. In one embodiment, at least 99.7% by mass of the crystalline structure of the crystalline oxide is in the (012) orientation. In one embodiment, at least 99.9% by mass of the crystalline structure of the crystalline oxide is in the (012) orientation. These percentages are expressed by mass of the total mass of the crystalline oxide (i.e. in all crystal orientations present).

In one embodiment, at least a portion of the crystalline structure of the crystalline oxide composition is in an orientation having the Miller index (003) (the orientations optionally being defined by reference to any of the definitions above). The presence of crystallites solely in the (003) orientation is undesirable from the purpose of the present invention as crystals having that orientation lack the roughness of the crystals having the preferred orientations above and solid-state batteries lack the favourable electrochemical properties of the lithium cobalt oxides having those crystal orientations. In one embodiment, at most 99.9% by mass of the crystalline structure of the crystalline oxide is in the (003) orientation. In one embodiment, at most 99.7% by mass of the crystalline structure of the crystalline oxide is in the (003) orientation. In one embodiment, at most 99.5% by mass of the crystalline structure of the crystalline oxide is in the (003) orientation. In one embodiment, at most 99% by mass of the crystalline structure of the crystalline oxide is in the (003) orientation. In one embodiment, at most 97% by mass of the crystalline structure of the crystalline oxide is in the (003) orientation. In one embodiment, at most 95% by mass of the crystalline structure of the crystalline oxide is in the (003) orientation. In one embodiment, at most 90% by mass of the crystalline structure of the crystalline oxide is in the (003) orientation. In one embodiment, at most 80% by mass of the crystalline structure of the crystalline oxide is in the (003) orientation. In one embodiment, at most 70% by mass of the crystalline structure of the crystalline oxide is in the (003) orientation. In one embodiment, at most 60% by mass of the crystalline structure of the crystalline oxide is in the (003) orientation. In one embodiment, at most 50% by mass of the crystalline structure of the crystalline oxide is in the (003) orientation. In one embodiment, at most 40% by mass of the crystalline structure of the crystalline oxide is in the (003) orientation. In one embodiment, at most 30% by mass of the crystalline structure of the crystalline oxide is in the (003) orientation. In one embodiment, at most 20% by mass of the crystalline structure of the crystalline oxide is in the (003) orientation. In one embodiment, at most 10% by mass of the crystalline structure of the crystalline oxide is in the (003) orientation. In one embodiment, at most 5% by mass of the crystalline structure of the crystalline oxide is in the (003) orientation. In one embodiment, at most 4% by mass of the crystalline structure of the crystalline oxide is in the (003) orientation. In one embodiment, at most 3% by mass of the crystalline structure of the crystalline lithium cobalt oxide is in the (003) orientation. In one embodiment, at most 2% by mass of the crystalline structure of the crystalline oxide is in the (003) orientation. In one embodiment, at most 1% by mass of the crystalline structure of the crystalline oxide is in the (003) orientation. In one embodiment, at most 0.5% by mass of the crystalline structure of the crystalline oxide composition is in the (003) orientation. In one embodiment, at most 0.3% by mass of the crystalline structure of the crystalline oxide is in the (003) orientation. In one embodiment, at most 0.1% by mass of the crystalline structure of the crystalline oxide is in the (003) orientation. These percentages are expressed by mass of the total mass of the crystalline composition (i.e. in all crystal orientations present).

When the composition of an embodiment of the present invention comprises a thin film layer (particularly although not exclusively wherein the thin-film layer comprises a seed layer of $Co_3O_4$), in one embodiment, at least 2.5% of the top surface of the thin film layer is crystalline oxide comprises a crystal orientation selected from (101), (104), (110), or a combination thereof. In one embodiment, at least 4.5% of the top surface is crystalline oxide comprising a crystal orientation selected from (101), (104), (110), or a combination thereof. In one embodiment, at least 5% of the top surface is crystalline oxide comprising a crystal orientation selected from (101), (104), (110), or a combination thereof. In one embodiment, at least 7.5% of the top surface is crystalline oxide comprising a crystal orientation selected from (101), (104), (110), or a combination thereof. In one embodiment, at least 10% of the top surface is crystalline oxide comprising a crystal orientation selected from (101), (104), (110), or a combination thereof. In one embodiment, at least 25% of the top surface is crystalline oxide comprising a crystal orientation selected from (101), (104), (110), or a combination thereof. In one embodiment, at least 50% of the top surface is crystalline oxide comprising a crystal orientation selected from (101), (104), (110), or a combination thereof. In one embodiment, at least 75% of the top surface is crystalline oxide comprising a crystal orientation selected from (101), (104), (110), or a combination thereof. In one embodiment, at least 80% of the top surface is crystalline oxide comprising a crystal orientation selected from (101), (104), (110), or a combination thereof. In one embodiment, at least 90% of the top surface is crystalline oxide comprising a crystal orientation selected from (101), (104), (110), or a combination thereof. In one embodiment, at least 95% of the top surface is crystalline oxide compris-ing a crystal orientation selected from (101), (104), (110), or a combination thereof. In one embodiment, greater than 95% of the top surface is crystalline oxide comprising a crystal orientation selected from (101), (104), (110), or a combination thereof. In one embodiment, greater than 97.5% of the top surface is crystalline oxide comprising a crystal orientation selected from (101), (104), (110), or a combination thereof. In one embodiment, greater than 99% of the top surface is crystalline oxide comprising a crystal orientation selected from (101), (104), (110), or a combination thereof. In one embodiment, greater than 99.5% of the top surface is crystalline oxide comprising a crystal orientation selected from (101), (104), (110), or a combination thereof.

In addition, or in the alternative, the crystalline structure of the composition may be defined in terms of bands in the Raman spectrum. As is known to those skilled in the art, in solid-state physics, Raman spectroscopy is used to characterize materials, measure temperature, and determine the crystallographic orientation of a sample.

Typically, the Raman spectrometer uses laser light, typically laser light in the visible or near infra-red portion of the electromagnetic spectrum (390 to 1000 nm), such as 450 to 900 nm, preferably 500 to 550 nm, more preferably 530 to 540 nm, and most preferably 532 nm. Typically, the Raman microscope has objectives ranging from 5× to 500×, preferably 10× to 100×. Typically, the Raman spectrometer has a spatial resolution (defined as sample surface spot area) of 0.5 to 2 $\mu m^2$, preferably 1 $\mu m^2$.

For a given sample, the bands in the Raman spectra may vary from the quoted wavenumber depending on the amount, crystal orientation and purity of the substance having that characteristic band. In one embodiment the wavenumbers of the bands in the Raman spectrum are quoted to ±25 $cm^{-1}$. In one embodiment the wavenumbers of the bands in the Raman spectrum are quoted to ±20 $cm^{-1}$. In one embodiment the wavenumbers of the bands in the Raman spectrum are quoted to ±15 $cm^{-1}$. In one embodiment the wavenumbers of the bands in the Raman spectrum are quoted to ±10 $cm^{-1}$. In one embodiment the wavenumbers of the bands in the Raman spectrum are quoted to ±5 $cm^{-1}$. In one embodiment the wavenumbers of the bands in the Raman spectrum are quoted to ±2 $cm^{-1}$. In one embodiment the wavenumbers of the bands in the Raman spectrum are quoted to ±1 $cm^{-1}$.

In one embodiment, the composition exhibits a band in the Raman spectrum at a wavenumber of 690 $cm^{-1}$ (to the tolerances quoted above, either in its broadest aspect or a preferred aspect). This band is typically characteristic of the presence of $A_{1g}$ mode of $Co_3O_4$ in the composition.

In one embodiment, the composition exhibits a band in the Raman spectrum at a wavenumber of 526 $cm^{-1}$ (to the tolerances quoted above, either in its broadest aspect or a preferred aspect). This band is typically characteristic of the presence of $F_{2g}$ of $Co_3O_4$ in the composition.

In one embodiment, the composition exhibits a band in the Raman spectrum at a wavenumber of 625 $cm^{-1}$ (to the tolerances quoted above, either in its broadest aspect or a preferred aspect). This band is typically characteristic of the presence of $F_{22}$ of $Co_3O_4$ in the composition.

In one embodiment, the composition exhibits a band in the Raman spectrum at a wavenumber of 484 $cm^{-1}$ (to the tolerances quoted above, either in its broadest aspect or a preferred aspect).

In one embodiment, the composition exhibits a band in the Raman spectrum at a wavenumber of 593 $cm^{-1}$ (to the tolerances quoted above, either in its broadest aspect or a preferred aspect).

In one embodiment, the (R-3m) crystalline structure of the lithium cobalt oxide composition exhibits at least one band in the Raman spectrum at a wavenumber selected from the group consisting of: 484 and 593 cm$^{-1}$ (both to the tolerances quoted above, either in its broadest aspect or a preferred aspect) attributed to the $A_{1g}$ and $E_g$ modes respectively. Raman bands at these wavenumbers are typically characteristic of the presence of the high temperature phase of lithium cobalt oxide having a crystal structure in one of the preferred orientations set out above.

In one embodiment, the composition exhibits a band in the Raman spectrum at a wavenumber of 690 cm$^{-1}$ (to the tolerances quoted above, either in its broadest aspect or a preferred aspect) and at least one other band at a wavenumber selected from the group consisting of: 484 and 593 cm$^{-1}$ (to the tolerances quoted above, either in its broadest aspect or a preferred aspect).

In addition, or in the alternative, the crystalline structure of the composition may be defined in terms of its powder X-ray diffraction pattern. As is known to the person skilled in the art, X-ray crystallography is a technique used for determining the atomic and molecular structure of a crystal, in which the crystalline atoms cause a beam of incident X-rays to diffract into many specific directions. By measuring the angles and intensities of these diffracted beams, a crystallographer can produce a three-dimensional picture of the density of electrons within the crystal. From this electron density, the mean positions of the atoms in the crystal can be determined, as well as their chemical bonds, their disorder, and various other information.

Typically, the X-ray diffraction uses a Cu Kα X-ray source. Typically, measurements are made using the following conditions $\theta_1=11°$, $\theta_2=21°$ and scan time=240 s. In one embodiment, the crystalline structure of the crystalline oxide can be described in terms of the measured two-theta (2θ) measurements of the peaks in the X-ray powder diffraction pattern. Typically, these measurements are quoted to ±0.2°, preferably ±0.1° and more preferably ±0.05°.

In one embodiment, the crystalline structure of the crystalline oxide exhibits at least one X-ray powder diffraction peak selected from the group consisting of: 2θ (±0.2°) 37.4°, 39.1°, 45.3° and 66.4°.

In one embodiment, the crystalline structure of the crystalline oxide exhibits an X-ray powder diffraction peak at 2θ (±0.2°) 37.4°. This peak is characteristic of $LiCoO_2$ in the (101) crystal orientation.

In one embodiment, the crystalline structure of the crystalline oxide exhibits an X-ray powder diffraction peak at 2θ (±0.2°) 39.1°. This peak is characteristic of $LiCoO_2$ in the (012) crystal orientation.

In one embodiment, the crystalline structure of the crystalline oxide exhibits an X-ray powder diffraction peak at 2θ (±0.2°) 45.3°. This peak is characteristic of $LiCoO_2$ in the (104) crystal orientation.

In one embodiment, the crystalline structure of the crystalline oxide exhibits an X-ray powder diffraction peak at 2θ (±0.2°) 66.4°. This peak is characteristic of $LiCoO_2$ in the (110) crystal orientation.

In one embodiment, the crystalline structure of the crystalline oxide can be described in terms of the 2θ measurement which corresponds to the distance (d) between adjacent lattice planes (d-spacing). Typically, these measurements are quoted to ±0.2 Å, preferably ±0.1 Å and more preferably ±0.05 Å.

In one embodiment, the crystalline structure of the crystalline oxide exhibits an X-ray powder diffraction peak at 2θ 37.4° corresponding to d (Å) 2.399 (±0.1). This peak is characteristic of $LiCoO_2$ in the (101) crystal orientation.

In one embodiment, the crystalline structure of the crystalline oxide exhibits an X-ray powder diffraction peak at 2θ 39.1° corresponding to d (Å) 2.301 (±0.1). This peak is characteristic of $LiCoO_2$ in the (012) crystal orientation.

In one embodiment, the crystalline structure of the crystalline oxide exhibits an X-ray powder diffraction peak at 2θ 45.3° corresponding to d (Å) 2.001 (±0.1). This peak is characteristic of $LiCoO_2$ in the (104) crystal orientation.

In one embodiment, the crystalline structure of the crystalline oxide exhibits an X-ray powder diffraction peak at 2θ 66.4° corresponding to d (Å) 1.406 (±0.1). This peak is characteristic of $LiCoO_2$ in the (110) crystal orientation.

In one embodiment, said crystalline oxide has a crystalline structure exhibiting an X-ray powder diffraction comprising peaks at 2θ selected from 37.4°, 45.3° or both 37.4° and 45.3°, corresponding to d(Å) (±0.1 Å) selected from 2.399 Å, 2.001 Å or both 2.399 Å and 2.001 Å.

It will be appreciated by the person skilled in the art that the crystalline structure of the lithium cobalt oxide composition may comprise crystallites having more than one of the above orientations, and therefore more than one of the above peaks may be observed in the powder X-ray diffraction pattern of a given sample of the composition.

In one embodiment, the crystalline structure of the lithium cobalt oxide composition exhibits at least one X-ray powder diffraction peak at 2θ selected from the group consisting 37.4°, 45.3° (each ±0.1°) or both, and/or of corresponding to d(Å) 2.399, 2.001 each (±0.1 Å) or both.

In one embodiment, there is provided a composition comprising a crystalline oxide of lithium and cobalt, wherein the lithium and cobalt atomic % are as defined above, either in its broadest aspect or a preferred aspect, the crystalline structure of the composition being characterized by a localized concentration of $Co_3O_4$, as defined above, either in its broadest aspect or a preferred aspect, the crystalline structure being further characterized by at least one of the following parameters (a) to (c):

(a) an orientation selected from the group consisting of: (101), (104), (110) and (012);
(b) a band in the Raman spectrum at a wavenumber of 690 cm$^{-1}$ (±5 cm$^{-1}$) and at least one other band at a wavenumber selected from the group consisting of: 484 and 593 cm$^{-1}$ (both ±5 cm$^{-1}$);
(c) at least one X-ray powder diffraction peak at 2θ selected from the group consisting of: 37.4°, 39.1°, 45.3° and 66.4° (each ±0.2°), and/or corresponding to d(Å) 2.399, 2.301, 2.001 or 1.406 (each ±0.1°).

In one embodiment, there is provided a composition comprising a crystalline oxide of lithium and cobalt, wherein the lithium and cobalt atomic % are as defined above, either in its broadest aspect or a preferred aspect, the crystalline structure of the composition being characterized by a localized concentration of $Co_3O_4$, as defined above, either in its broadest aspect or a preferred aspect, and an orientation selected from the group consisting of: (101), (104), (110) and (012), preferably (101) or (104).

In one embodiment, there is provided a composition comprising a crystalline oxide of lithium and cobalt, wherein the lithium and cobalt atomic % are as defined above, either in its broadest aspect or a preferred aspect, the crystalline structure of the composition being characterized by a localized concentration of $Co_3O_4$, as defined above, either in its broadest aspect or a preferred aspect, and by a band in the Raman spectrum at a wavenumber of 690 cm$^{-1}$ (±5 cm$^{-1}$).

In one embodiment, there is provided a composition comprising a crystalline oxide of lithium and cobalt, wherein the lithium and cobalt atomic % are as defined above, either in its broadest aspect or a preferred aspect, the crystalline structure of the composition being characterized by a localized concentration of $Co_3O_4$, as defined above, either in its broadest aspect or a preferred aspect, and by at least one X-ray powder diffraction peak at selected from the group consisting of: 37.4°, 39.1°, 45.3° and 66.4° (each ±0.2°), and/or corresponding to spacing d(Å) 2.399, 2.301, 2.001 or 1.406, preferably (±0.1°) 37.4° or 45.3° corresponding to spacing d(Å) 2.399 or 2.001.

Typically, the lithium cobalt oxide is formed in the form of a film, especially a film on a substrate (as defined in more detail below). In one embodiment, the thickness of the crystalline lithium cobalt oxide composition is from 1 to 30 µm. In one embodiment, the thickness of the crystalline lithium cobalt oxide composition is from 2 to 20 µm. In one embodiment, the thickness of the crystalline lithium cobalt oxide composition is from 3 to 12 µm. In one embodiment, the thickness of the crystalline lithium cobalt oxide composition is from 5 to 10 µm. In one embodiment, the thickness of the crystalline lithium cobalt oxide composition is from 6 to 7 µm.

Methods

The invention may also provide a method of preparing a composition comprising $Co_3O_4$ and crystalline lithium cobalt oxide, particularly although not exclusively the composition according to the first aspect of the invention. The method generally comprises providing a source of each component element of the compound, wherein the sources comprise a source of lithium, a source of oxygen and a source of cobalt (and optionally a source of one or more dopant elements as defined below); and depositing these onto a substrate, particularly although not exclusively a substrate heated to between about 50° C. and about 800° C. The component elements from the sources react on the substrate to form a crystalline oxide of lithium and cobalt (optionally doped with one or more of the elements defined below) and the component elements from the sources of cobalt and oxygen react on the substrate to form $Co_3O_4$.

Typically, the method involves forming the crystalline lithium cobalt oxide (or crystalline doped lithium cobalt oxide) in the form of a film, typically on a substrate. Suitable substrates are well known to the person skilled in the art, and include metals (such as platinum, aluminium, titanium, chromium, iron, zinc, gold, silver, nickel, molybdenum, including alloys thereof, which may include non-metals such as carbon, examples of which include steels such as stainless steel), metal oxides, such as aluminium oxide, particularly conducting metal oxides such as indium tin oxide), silicon, silica, silicon oxide (including doped silicon oxide), aluminosilicate materials, glasses, and ceramic material.

In contrast to the methods described in the prior art, the method of an example of the invention has the distinguishing feature that one or more conditions of the method are varied such that a localized concentration of $Co_3O_4$ (as defined above, either in its broadest aspect or a preferred aspect) formed so as to enable crystal growth of a lithium cobalt oxide composition having the desired crystalline structure (as defined above, either in its broadest aspect or a preferred aspect).

In one embodiment, the method is characterized in that one or more conditions of the method are varied such that a localized concentration of $Co_3O_4$ is formed as a seed layer so as to enable crystal growth of a composition having the required crystalline structure, and greater roughness/irregularity (as described above) than those of the prior art.

The method generally comprises providing a source of each component element of the compound, wherein the sources comprise a source of lithium, a source of oxygen and a source of cobalt, and optionally a source of one or more of the dopant elements listed herein. The precise nature of the sources of such elements is not critical to the present invention provided that it contains the required element.

The reaction of the component elements to form the compound occurs on the surface of the substrate rather than in the vapor phase prior to deposition on the substrate. While not wishing to be bound by theory, it is believed that each component element in the vapor form collides with and adheres to the surface of the heated substrate, where the atoms of each element are then mobile on the surface and so are able to react with each other to form the oxide compound.

In one embodiment, the vapor source comprises an electron beam evaporator or a Knudsen cell (K-Cell); these are well-suited for materials with low partial pressures. In both cases the material is held in a crucible and heated to generate a flux of atoms. A Knudsen cell uses a series of heating filaments around the crucible, whereas in an electron beam evaporator the heating is achieved by using magnets to direct a beam of high energy electrons onto the material.

Typically, lithium and cobalt can be deposited from a Knudsen cell source or an electron gun (E-gun).

In one embodiment, the source of oxygen is molecular oxygen. In one embodiment, the source of oxygen is atomic oxygen (typically although not exclusively produced by means of an oxygen plasma source). In one embodiment, the source of oxygen is an ozone source.

An oxygen plasma source delivers plasma-phase oxygen, i.e. a flux of oxygen atoms, radicals and ions. The source may be a radio frequency (RF) plasma source or ozone source for example.

Further gases (typically inert gases, e.g. noble gases such as helium, neon, argon, krypton and xenon; or nitrogen; preferably argon and/or nitrogen) may be added to the oxygen flow in small quantities if desired. Where present, the one or more further gases is present in a total proportion of up to 10%, such as up to 5%, such as up to 3%, such as up to 2%, such as up to 1%. This is typically measured by a Residual Gas Analyser (RGA) and is defined as molar % relative to 100 mol % oxygen, by dividing the partial pressure of the one or more further gases by the oxygen partial pressure.

In addition to sources of lithium, cobalt and oxygen, sources of other dopant elements (as defined and exemplified above) which form part of the crystal structure of the intended composition may also be present. In one embodiment, the method additionally comprises providing a source of one or more elements selected from the group consisting of: magnesium, calcium, strontium, titanium, zirconium, vanadium, chromium, manganese, iron, ruthenium, nickel, zinc, copper, molybdenum, boron, aluminium, gallium, tin, lead, bismuth, lanthanum, cerium, gadolinium and europium such that the one or more elements form part of the crystalline composition having the required crystal structure.

Alternatively, an amorphous film could be deposited, and then the method of the invention could be used to anneal the amorphous form. However, this is not preferred as such a method does not exhibit the advantages of the invention, such as the direct formation of stoichiometric compounds at low substrate temperature and avoiding the requirement for higher temperature post deposition annealing.

One general method used in accordance with one embodiment of the invention is a physical vapor deposition (PVD) method. According to this method, the crystalline lithium cobalt oxide composition is formed from the component elements lithium, cobalt and oxygen, by providing a vapor source of each component element of the compound and co-depositing the component elements from the vapor sources onto a substrate, typically a heated substrate.

Accordingly, in this embodiment, there is provided a vapor deposition method comprising: providing a vapor source of each component element of the compound, wherein the vapor sources comprise a source of lithium, a source of oxygen and a source of cobalt and optionally, a source of at least one dopant element selected from the group consisting of: magnesium, calcium, strontium, titanium, zirconium, vanadium, chromium, manganese, iron, ruthenium, copper, molybdenum, nickel, zinc, boron, aluminium, gallium, tin, lead, bismuth, lanthanum, cerium, gadolinium and europium, to deliver a flux of lithium, a flux of oxygen, a flux of cobalt and optionally a flux of the said at least one dopant elements; heating a substrate to between substantially 50° C. and 800° C.; depositing the component elements from the sources onto the heated substrate, wherein the component elements react on the substrate to form a crystalline oxide of lithium and cobalt, optionally containing one or more dopant elements; characterized in that during or preceding the co-depositing, one or more conditions of the vapor deposition method are varied such that a localized concentration of $Co_3O_4$ is formed so as to enable crystal growth of a composition having the required crystalline structure.

The physical vapor deposition (PVD) method according to an aspect of the invention typically involves co-depositing the component elements from the vapor sources onto a heated substrate. In one embodiment, the substrate is heated to about 150 to about 700° C. In one embodiment, the substrate is heated to about 200 to about 700° C. In one embodiment, the substrate is heated to about 300 to about 450° C.

The physical vapor deposition (PVD) method according to an aspect of the invention is typically carried out at a pressure of $1\times10^{-7}$ to $1\times10^{-4}$ Torr, preferably $1\times10^{-6}$ to $5\times10^{-5}$ Torr, and more preferably $5\times10^{-6}$ to $2\times10^{-5}$ Torr.

Typically, the method is carried out such that the deposition rate of the film is between 0.1 and 10 μm/hour. In one embodiment, the method is carried out such that the deposition rate is between 0.2 and 5 μm/hour. In one embodiment, the method is carried out such that the deposition rate is between 0.3 and 1.6 μm/hour. In one embodiment, the method is carried out such that the deposition rate is between 0.4 and 0.8 μm/hour.

According to this aspect of the invention, one or more conditions of the vapor deposition method are varied such that a localized concentration of $Co_3O_4$ is formed so as to enable crystal growth of a composition having the required crystalline structure. In one embodiment, the varying one or more conditions comprises delivering the cobalt and the lithium at a ratio of fluxes different from the ratio of fluxes delivered to deposit a crystalline oxide of lithium and cobalt. Without wishing to be bound by theory, it is believed that delivering the cobalt and the lithium at a ratio of fluxes different from the ratio of fluxes delivered to deposit crystalline lithium cobalt oxide may allow $Co_3O_4$ to be formed (typically as a seeding layer) so as to enable crystal growth of a lithium cobalt oxide composition having the required crystalline structure.

In one embodiment, the flux of cobalt is between 0.1 and 13 Å/s. In one embodiment, the flux of cobalt is between 0.1 and 7 Å/s. In one embodiment, the flux of cobalt is between 0.4 and 2 Å/s. In one embodiment, the flux of cobalt is between 0.5 and 1 Å/s. This flux is typically measured at the substrate surface. Typically, the flux of cobalt is measured in the presence of oxygen (such that, when it is measured in this way, what is actually measured is the flux of cobalt oxide).

In one embodiment, the flux of lithium is between 0.1 and 26 Å/s. In one embodiment, the flux of lithium is between 0.5 and 13 Å/s. In one embodiment, the flux of lithium is between 0.7 and 4 Å/s In one embodiment, the flux of lithium is between 0.8 and 2.2 Å/s. This flux is typically measured at the substrate surface.

Typically, the flux of lithium is measured in the presence of oxygen (such that, when it is measured in this way, what is actually measured is the flux of lithium oxide).

When the one or more dopant elements are present, in one embodiment, the flux of the dopant element(s) is between 0.1 and 13 Å/s. In one embodiment, the flux of the dopant element(s) is between 0.1 and 7 Å/s. In one embodiment, the flux of the dopant element(s) is between 0.4 and 2 Å/s. In one embodiment, the flux of the dopant element(s) is between 0.5 and 1 Å/s. This flux is typically measured at the substrate surface. Typically, the flux of the dopant element(s) is measured in the presence of (such that, when it is measured in this way, what is actually measured is the flux of its corresponding oxide).

The ability to measure the rates of the individual atomic fluxes and make changes during the deposition allows for control of the composition through the film thickness and can be used to either account for any changes in the vapor source conditions (e.g. aging or drift of the source) to maintain a constant lithium-cobalt composition through the film or to produce films with a change in lithium-cobalt composition during the deposition. The rate of the individual atomic fluxes can be measured either directly at the source during the deposition, and/or indirectly (by measuring the oxygen partial pressure during the deposition). In one embodiment, the rate of the individual atomic fluxes is measured by electron-impact emission spectroscopy (EIES).

According to this aspect of the invention, producing a controlled change in the composition during the deposition can be effectively used to produce a seed layer within the film. For example, the inclusion of a seed layer of $Co_3O_4$ within the film during deposition may be achieved by altering the individual atomic fluxes by the preferred methods set out below.

In one embodiment, the varying one or more conditions comprises the flux of cobalt exceeding the flux of lithium required to deposit a crystalline oxide of lithium and cobalt.

In one embodiment, the flux of cobalt is increased relative to a cobalt flux level required to deposit a crystalline oxide of lithium and cobalt, and the flux of lithium is maintained at a lithium flux level required to deposit a crystalline oxide of lithium and cobalt.

In one embodiment, the flux of cobalt is maintained at a cobalt flux level required to deposit a crystalline oxide of lithium and cobalt, and the flux of lithium is decreased relative to a lithium flux level required to deposit a crystalline oxide of lithium and cobalt.

In one embodiment, the flux of oxygen is decreased. In one embodiment, wherein the oxygen is delivered together with an inert gas (as defined and exemplified above), the flux of oxygen is maintained at the same level, the control conferred by the dilution of the oxygen and consequent reduction in its partial pressure.

Controlling the rates of the atomic fluxes is only one method which may be used to control the morphology of the lithium cobalt oxide in the physical vapor deposition embodiment. Other methods which may be used in order to provide a localized concentration (such as a seed layer) of $Co_3O_4$, may include stopping the flux of lithium by closing of the lithium shutter, and variation of the oxygen partial pressure in the chamber (by varying oxygen flow rate or addition of further gases, for example argon).

In one embodiment, the vapor deposition method comprises co-depositing the component elements onto the heated substrate comprises co-depositing the component elements directly onto a surface of the heated substrate. In one embodiment, the vapor deposition method comprises co-depositing the component elements onto the heated substrate comprises co-depositing the component elements onto one or more layers supported on the substrate.

In accordance with one example of the invention, the vapor deposition method is that generally described in WO 2015/104539, varied according to this aspect of the invention to produce the required localized concentration of $Co_3O_4$.

In one embodiment, the depositions described in WO 2015/104539 were carried out in a physical vapor deposition (PVD) system heated to between 50-800° C.; for LCO films being deposited on to a bare substrate or a current collector layer (not containing heat sensitive battery layers) the temperature is preferably 300-450° C., however higher substrate temperatures up to 800° C. can be used.

In one embodiment, the method additionally comprises annealing the deposited lithium cobalt oxide film after the deposition. This additional step is particularly useful when the deposition is carried out at temperatures below 400° C. Typically, when the lithium cobalt oxide film is deposited onto a previously deposited battery layers to form a stacked battery, the annealing temperature of the substrate is preferably heated to 300-450° C.

Conventionally, it is thought that the deposition of crystalline lithium cobalt oxide through the method of providing separate vapour sources of lithium, oxygen and cobalt (and optionally a vapour source of one or more dopant elements) and controlling the individual source fluxes to co-deposit these onto a substrate, such that they react on the substrate to form the crystalline oxide, may allow the formation of $Co_3O_4$ to be avoided (as discussed above, cobalt oxide ($Co_3O_4$) is conventionally considered an impurity in $LiCoO_2$ compositions). Therefore, the use of this method to deliberately prepare a composition comprising $Co_3O_4$ and crystalline lithium cobalt oxide may be considered to be counterintuitive.

In the alternative, the method according to the invention may be carried out by sputtering. As is known to the person skilled in the art, sputter deposition is a physical vapor deposition (PVD) method of thin film deposition by sputtering. Sputtering involves ejecting material from one or more targets that is a source of the required element(s) and directing it onto a substrate to enable growth of the required material, typically as a film on the substrate.

Therefore, in one embodiment, there is provided a method of producing the composition of an embodiment of the invention, wherein the method is a sputtering deposition method comprising:
    providing at least one sputtering target, at least one sputtering target comprising a source of lithium, at least one sputtering target comprising a source of cobalt, and
    optionally one or more sputtering targets comprising a source of at least one dopant element selected from the group consisting of: magnesium, calcium, strontium, titanium, zirconium, vanadium, chromium, manganese, iron, ruthenium, copper, molybdenum, nickel, zinc, boron, aluminium, gallium, tin, lead, bismuth, lanthanum, cerium, gadolinium and europium, the sputtering targets being the same or different; and
    sputtering said targets to produce a composition comprising $Co_3O_4$ and a crystalline oxide of lithium and cobalt, optionally doped with at least one of said dopant elements.

Typically, the sputtering target that provides a source of the required element comprises the oxide of that element, such that the target provides both the source of the element and at least part of the source of the oxygen. In one embodiment, the sputtering target that is a source of lithium comprises lithium oxide ($Li_2O$). In one embodiment, the sputtering target that is a source of cobalt comprises cobalt (II) oxide (CoO). In one embodiment, the sputtering target that is a source of cobalt is cobalt (III) oxide ($Co_2O_3$). In one embodiment, the sputtering target that is a source of cobalt comprises $Co_3O_4$.

In one embodiment, the sputtering may be carried out using a single target which provides the sources of both lithium and cobalt, preferably as an oxide. In this embodiment, the sputtering target which provides the sources of both lithium and cobalt comprises $LiCoO_2$. This target may optionally have additional lithium added (e.g. $Li_2O$) thereto to provide a composition having a greater proportion of lithium. In this embodiment, the oxygen partial pressure may be varied during deposition of the composition in order to achieve localised concentrations of $Co_3O_4$.

In one embodiment, the sputtering may be carried out using one sputtering target which provides the source of lithium and part of the source of cobalt, preferably as an oxide, more preferably $LiCoO_2$ (to which $Li_2O$ is optionally added) and at least one different sputtering target which provides part of the source of cobalt, typically comprising $Co_3O_4$.

When the intended composition contains one or more one dopant elements selected from the group consisting of: magnesium, calcium, strontium, titanium, zirconium, vanadium, chromium, manganese, iron, ruthenium, copper, molybdenum, nickel, zinc, boron, aluminium, gallium, tin, lead, bismuth, lanthanum, cerium, gadolinium and europium, the sputtering target typically comprises the oxide of that element. The sputtering target containing the oxide of the dopant element(s) may be the same or different to the sputtering target(s) containing the oxide of lithium and/or the oxide of cobalt.

When the sputtering targets are different, the targets may be sputtered at the same time or sequentially.

In one embodiment, there is provided a method of producing a composition of an embodiment of the invention, wherein the method is a sputtering deposition method comprising:
    providing a first sputtering target comprising cobalt oxide;
    providing a second sputtering target comprising a source of (a) lithium cobalt oxide or (b) lithium cobalt oxide comprising at least one dopant element selected from the group consisting of magnesium, calcium, strontium, titanium, zirconium, vanadium, chromium, manganese, iron, ruthenium, copper, molybdenum, nickel, zinc, boron, aluminium, gallium, tin, lead, bismuth, lanthanum, cerium, gadolinium and europium;

sputtering said first sputtering target and said second sputtering target to produce a composition comprising $Co_3O_4$ and a crystalline oxide of lithium and cobalt, optionally doped with at least one of said dopant elements.

In one embodiment, there is provided a method of producing a composition of an embodiment of the invention, wherein the method is a sputtering deposition method comprising:
sputtering said first target to produce a thin-film layer of $Co_3O_4$ followed by sputtering said second target to produce a thin-film crystalline oxide of lithium and cobalt, optionally doped with at least one of said dopant elements.

In one embodiment, there is provided a method of producing a composition of an embodiment of the invention, wherein the method is a sputtering deposition method comprising:
sputtering said first target to produce a thin-film layer of $Co_3O_4$ with a top surface and a bottom surface; and
sputtering said second target to produce a thin-film crystalline oxide of lithium and cobalt, optionally doped with at least one of said dopant elements, on the top surface of said thin-film layer of $Co_3O_4$.

In one embodiment, there is provided a method of producing a composition of an embodiment of the invention, wherein the method is a sputtering deposition method comprising:
providing a first sputtering target comprising $Li_2O$ and/or an oxide of lithium and cobalt and a second sputtering target comprising an oxide of cobalt (preferably $Co_3O_4$); and
sputtering said targets coincidentally to produce a mixed thin-film layer comprising $Co_3O_4$ and a crystalline oxide of lithium and cobalt.

In one embodiment, there is provided a method of producing a composition of an embodiment of the invention, wherein the method is a sputtering deposition method comprising:
providing a first sputtering target comprising $Li_2O$ and/or an oxide of lithium and cobalt, and a second sputtering target comprising an oxide of cobalt, preferably $Co_3O_4$; and
sputtering said second target to produce a thin-film layer of $Co_3O_4$ followed by sputtering said first target to produce a thin-film crystalline oxide of lithium and cobalt of the surface of said thin-film layer of $Co_3O_4$.

Typically, the high energy particles are gas ions. In one embodiment, the gas ions are argon ions.

Examples of types of sputter deposition include RF sputtering, DC sputtering, pulsed-DC sputtering, ion-beam sputtering, reactive sputtering, high-target utilization sputtering (HiTUS), high-power impulse magnetron sputtering (HiPiMS) and gas flow sputtering.

The sputtering method according to this example of the invention is typically carried out at a pressure of $1\times10^{-4}$ to $1\times10^{-2}$ Torr, preferably $5\times10^{-4}$ to $5\times10^{-2}$ Torr, and more preferably $1\times10^{-3}$ to $2\times10^{-3}$ Torr.

In the alternative, the method according to the invention may be carried out by chemical vapor deposition. As is known to the person skilled in the art, chemical vapor deposition comprises providing a vapor source of each component element of the desired substance, wherein the sources comprise one or more precursor compounds containing the required element, and depositing the vaporised elements onto a heated substrate, typically by spraying. The component elements from the sources react on the substrate to form the desired material.

Accordingly, there is further provided a method of producing a crystalline lithium cobalt oxide composition (particularly although not exclusively the composition of an embodiment of the invention) wherein the method is a vapor deposition method comprising:
providing a source of each component element of the compound, wherein the sources comprise one or more precursor compounds, at least one precursor compound containing lithium, at least one precursor compound containing cobalt, and at least one precursor compound containing oxygen;
heating a substrate to between about 200° C. and about 1000° C.;
spraying the precursor compounds onto the heated substrate;
wherein the component elements from the sources react on the substrate to form a crystalline oxide of lithium and cobalt;
characterized in that one or more conditions of the method are varied such that a localized concentration of $Co_3O_4$ is formed so as to enable crystal growth of a composition having the required crystalline structure.

In one embodiment, the substrate is heated to between 250 and 950° C. In one embodiment, the substrate is heated to between 300 and 600° C.

The CVD method according to this example of the invention is typically carried out at a pressure of 0.1 to 500 Torr, preferably 1 to 100 Torr.

In one embodiment, the precursor compounds are mixed to form a sol prior to spraying on the heated substrate.

The precursor compounds are not particularly limited provided that at least one precursor compound includes lithium and at least one precursor compound contains cobalt. In one embodiment, the precursor compound containing lithium comprises a lithium salt and/or the precursor compound containing cobalt comprises a cobalt salt.

Electrode

The crystalline lithium cobalt oxide composition of an embodiment of the present invention is particularly useful for the formation of electrodes, typically for use in cells such as electrochemical cells and fuel cells.

Accordingly, according to a further aspect the invention further provides an electrode comprising the crystalline lithium cobalt oxide composition of an embodiment of the invention (as defined above, either in its broadest aspect or a preferred aspect).

Typically, in the electrode of an embodiment of the invention, the crystalline lithium cobalt oxide composition is supported on a support. In one embodiment, the crystalline lithium cobalt oxide composition forms a layer on the support.

Typically, the support is a substrate on which a current collecting material is supported. In one embodiment, the current collecting material is a metal or a conducting metal oxide. In one embodiment, the current collecting material is selected from the group consisting of: platinum, aluminium, titanium, chromium, iron, zinc, gold, silver, nickel, molybdenum, tin oxide, indium tin oxide and stainless steel.

Typically, the substrate is an inert substrate. In one embodiment, the substrate is selected from the group consisting of: silicon, silicon oxide, aluminium oxide, an aluminosilicate material, doped silicon oxide, a glass, a metal, and a ceramic material.

In one embodiment, the substrate is a silicon substrate. In one embodiment, the silicon substrate is covered by one or more passivation layers. In one embodiment, at least one passivation layer comprises silicon dioxide. In one embodiment, at least one further passivation layer comprises silicon nitride.

In one embodiment, an adhesion layer is present between the current collector and substrate. In one embodiment, the adhesion layer is selected from a metal and a metal oxide. In one embodiment, the adhesion layer is selected from the group consisting of: titanium oxide, titanium, zirconium and chromium.

Electrochemical Cell

The crystalline lithium cobalt oxide composition of an embodiment of the present invention may usefully be used in a cell, particularly an electrochemical cell.

Accordingly, to a further aspect of the invention there is provided an electrochemical cell comprising: an electrolyte; an anode; and a cathode; wherein the anode and/or the cathode comprises an electrode according to the present invention.

It has been found that the lithium cobalt oxide composition of an embodiment of the present invention is particularly suitable for use at the cathode of such a cell.

Accordingly, the invention further provides an electrochemical cell, as defined above, wherein the cathode comprises an electrode according to the present invention.

The cell may be a solid-state cell (also referred to as a solid-state battery).

Typically, the cell is a lithium-ion battery. As defined above, in a lithium-ion battery, lithium ions (Li$^+$) move from the negative electrode to the positive electrode during discharge and back when charging. Accordingly, the invention further provides a lithium-ion battery, as defined above, wherein the cathode comprises an electrode according to the present invention.

The electrolyte may be any electrolyte typically used in electrochemical cells. However, it is particularly preferred that the electrolyte is a solid electrolyte. The application of lithium cobalt oxide compositions of an embodiment of the present invention in batteries using a solid electrolyte, confers improved properties (in particular cycle life, capacity, adhesion to the underlying layers and control of stresses) has not been previously disclosed in the art.

Examples of solid-state electrolytes include the following:
Lithium phosphorus oxynitride (LiPON)
Lithium borosilicate (as described in WO2017/216532, WO2015/104540 and WO2015/104538)
Sulfide based glassy and glass-ceramic electrolytes e.g. LPS (xLi$_2$S-yP$_2$S$_5$), Li$_2$—SiS$_2$
Garnet-type solid electrolytes e.g. Li$_5$La$_3$M$_2$O$_{12}$ or LLZO (Li$_7$La$_3$Zr$_2$O$_{12}$)
Argyrodite-type e.g. Li$_6$PS$_5$X (wherein X is halogen, e.g. Cl, Br, I)
Oxide based perovskite-type solid electrolytes e.g. LLTO (Li$_{0.5}$La$_{0.5}$TiO$_3$)
LISICON-type e.g. Li$_{10}$GeP$_2$S$_{12}$, NASICON-type e.g. Li1.4[Al$_{0.4}$Ge$_{1.6}$(PO$_4$)$_3$], LATP (Li$_{1+x}$Al$_x$Ti$_{2-x}$(PO$_4$)$_3$
Solid polymer electrolytes e.g. polyethylene oxide (PEO)

In one embodiment, the electrolyte comprises lithium phosphorus oxynitride (LiPON).

There is also provided a method of making a solid-state cell, comprising depositing an electrode of the cell as a layer of a crystalline lithium cobalt oxide composition according to an embodiment of the present invention using a method according to the invention.

After deposition of the lithium cobalt oxide composition the further layers of the solid-state battery are deposited using a vapor deposition technique such as physical vapor deposition or sputtering to create a multi-layered structure. The creation of a solid-state battery solely by PVD has been described previously in WO2015/104538. Preferred layers of the solid-state battery and methods of their production are indicated below. However, as is known to the person skilled in the art, the layers and method of manufacture of the solid-state battery are not limited to those set out below.

| Layer | Example deposition technique |
|---|---|
| TiO$_2$ seeding layer | Sputtering |
| Pt current collector | Sputtering |
| LiCoO$_2$ | As described herein - e.g. PVD, sputtering, CVD |
| Solid electrolyte (selected from those listed above (e.g. LiPON or LiBSiO) | Sputtering or PVD |
| Si | PVD or sputtering |
| Pt current collector | Sputtering |
| Dielectric encapsulation layers | Sputtering |

In one embodiment, the electrochemical cell is a fuel cell. As is known to the person skilled in the art, a fuel cell is an electrochemical cell that converts the chemical energy from a fuel into electricity through an electrochemical reaction of a fuel (typically hydrogen or a simple organic compound, e.g. methanol or formic acid) with oxygen or another oxidising agent. Fuel cells are different from batteries in requiring a continuous source of fuel and oxygen (usually from air) to sustain the chemical reaction, whereas in a battery the chemical energy comes from chemicals already present in the battery. Fuel cells can produce electricity continuously for as long as fuel and oxygen are supplied.

Therefore, in a further aspect of the invention there is provided a fuel cell comprising: an anode; a cathode; and an electrolyte; wherein the anode and/or the cathode comprises the crystalline oxide material of an embodiment of the invention.

The fuel cell also typically comprises, or is connected to, a fuel supply. In one embodiment the fuel is hydrogen. In one embodiment the fuel is an organic compound, typical examples of which include methane, methanol, ethanol, formic acid and acetic acid.

The fuel cell also typically comprises, or is connected to, a supply of oxidant. In one embodiment, the oxidant is molecular oxygen. In one embodiment, the oxidant is an oxidising agent, examples of which are known to those skilled in the art.

There is also provided an electronic device comprising an electrochemical cell (especially a lithium ion battery) according to the invention. Examples of such electronic devices are well known to those skilled in the art, and include hand held electronic devices such as mobile telephones.

Examples

FIG. 1 shows a schematic representation of an example apparatus 10 suitable for implementing the physical vapor deposition embodiment of the method of the present invention. The deposition is carried out within a vacuum system 12, which may be an ultrahigh vacuum system. A substrate 14 of a desired material (depending on the intended purpose of the deposited material) is mounted within the vacuum system 12, and heated above room temperature using a heater 16. Also within the vacuum system is a plurality of vapor sources, one source for each of the component elements in the desired thin film compound. A first vapor source 18 comprises a source of atomic oxygen, such as an oxygen plasma source. A second vapor source 20 comprises a source of lithium vapor. A third vapor source 22 comprises a source of cobalt vapor.

During the deposition process, a controlled flux of each component element is released from its respective vapor source onto the heated substrate 14, whereupon the various elements are co-deposited. The elements react on the substrate 14 to form a thin film layer 29 of the crystalline lithium cobalt oxide.

A significant advantage of the physical deposition method described is that deposition of the constituents of the compound directly from the elements allows for direct control of the compound composition and structure via the rates of deposition of the component elements. The flux of each element can be independently controlled by appropriate operation of its respective vapor source so that the chemical composition of the deposited compound can be tailored according to exacting requirements if desired.

During the deposition the rates of the fluxes of lithium and cobalt are monitored, and appropriate adjustments made to the respective vapor sources, if desired. The deposition rates of both the lithium and cobalt fluxes can be measured for example using quartz crystal microbalance (QCM) or electron-impact emission spectroscopy (EIES). The cobalt flux can also be monitored indirectly by monitoring the stability of the oxygen pressure within the deposition chamber using a Residual Gas Analyser (RGA) or an ion gauge; the reactivity of the cobalt flux towards oxygen means that an inverse change in oxygen pressure is observed when the cobalt flux changes. The gases present in the vacuum system, namely oxygen, nitrogen, argon, carbon dioxide (trace), and carbon monoxide (trace) can be monitored using a Residual Gas Analyser (RGA) and the total pressure measured using an ion gauge.

Changes to pressures of gases being introduced into the system can be made by altering the flow of gases into the chamber. Further to this the film growth can be monitored during the deposition for example by ellipsometry and other optical techniques.

Producing a film with a non-constant composition/inclusion of a seed layer can be advantageous as it can allow for control of the structure and morphology of the film, for example by introducing defects which can act as nucleation sites for crystal growth. Controlling the composition of the film in this way can also influence properties of the film such as the adhesion to the surrounding layers and help to balance stress within the film. Such precise control of the film composition and the ability to adjust during the deposition, thus controlling the properties of the final film, confers an advantage of the method of the present invention with other techniques such as pulsed laser deposition (PLD) which can suffer from preferential loss of lighter elements such as lithium, making control of the composition in the final film more difficult.

According to this method, $LiCoO_2$ films of thicknesses 1-30 μm may be deposited for use in solid-state batteries. Before depositing $LiCoO_2$ for use in a solid-state battery thinner<1 μm (typically ~250 nm) test $LiCoO_2$ layers are deposited using the same method, the structure and composition of these test layers are analysed by Raman spectroscopy and laser ablation inductively coupled plasma mass spectrometry (LA-ICP-MS).

When a suitable test sample is obtained the conditions are repeated during a longer deposition to obtain the thicker $LiCoO_2$ films for use in solid-state batteries.

Raman Spectroscopy is a powerful technique for the microstructural analysis of $LiCoO_2$ due to the different crystal structures providing a Raman fingerprint. One should expect to observe two Raman bands for the R-3m (high temperature) phase (HT-LCO) and four bands for the low temperature (Fd3m) (LT-LCO). In addition Raman spectroscopy is able to detect the secondary product $Co_3O_4$ even at trace/impurity level, due to the strong scattering intensity of this oxide. Raman spectroscopy is a particularly effective method to study these materials.

The Raman spectrometer used in these Examples is a Horiba XploRA Plus equipped with a 532 nm (green) laser and 10×, 50× and 100× microscope objectives. For a 532 nm laser with a 0.90NA/100× objective this would predict a spatial resolution of 361 nm. However, the optical processes occurring during Raman microscopy are much more complex than for standard light microscopy. A number of factors can reduce this resolution. Thus, typical Raman spatial resolution is usually quoted as 1 μm (although this can be improved under ideal conditions).

Raman spectroscopy measurements are taken following acquisition parameters shown in Table 1. Top down measurements use objective 50×, slit 50, hole 100, filter 2%. Cross section measurements use same settings as above although objective 100× and accumulation is 2 using a line with pitch 1 μm, number of points to cover whole sample.

TABLE 1

| Material | Acquisition Range/cm$^{-1}$ | Grating | Acquisition Time/s | Accumulation |
|---|---|---|---|---|
| lithium cobalt oxide | 300 to 1200 | 2400T | 30 | 4 |

Laser ablation inductively coupled plasma mass spectrometry (LA-ICP-MS) is used to determine the lithium-cobalt ratio present in the film. In an preferred aspect, lithium cobalt oxide films may be formed which are slightly lithium-deficient in composition, for example with lithium:cobalt ratios of 47.5-49.1% lithium and 52.5-50.9% cobalt (expressed as a percentage of the total metal atoms excluding oxygen).

Figure 2:
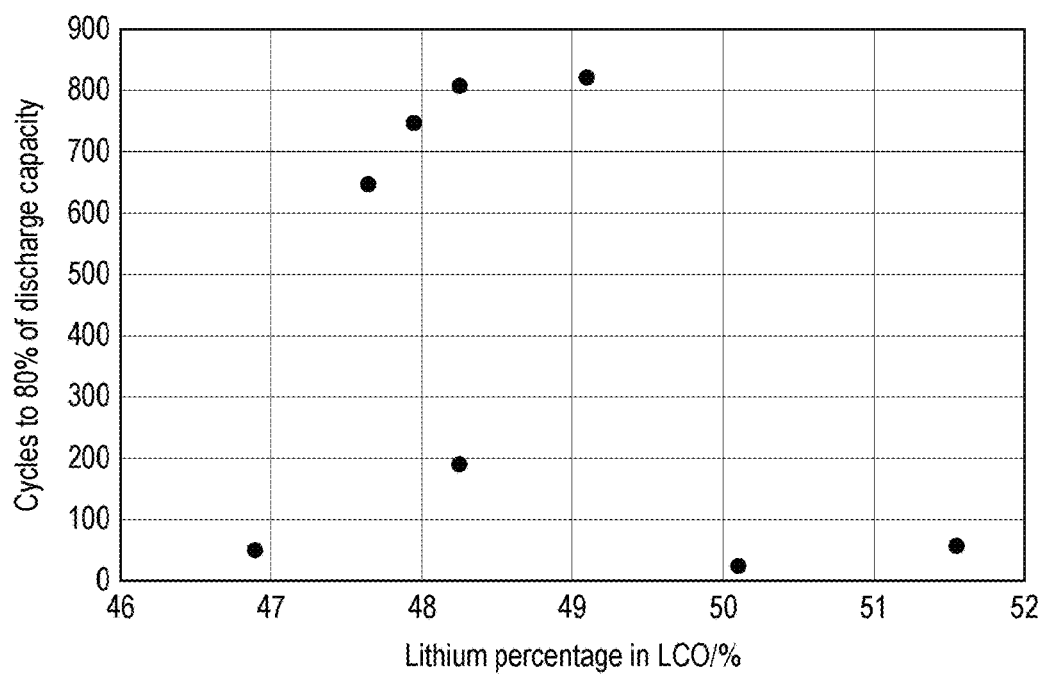
FIG. 2 shows the number of cycles to 80% of (5th cycle) discharge capacity when cycled at 100% depth of discharge (DoD) at a rate of 1 C at a temperature of 25° C. versus lithium percentage in lithium cobalt oxides as measured by laser ablation inductively coupled plasma mass spectrometry (LA-ICP-MS).
Figure 3:
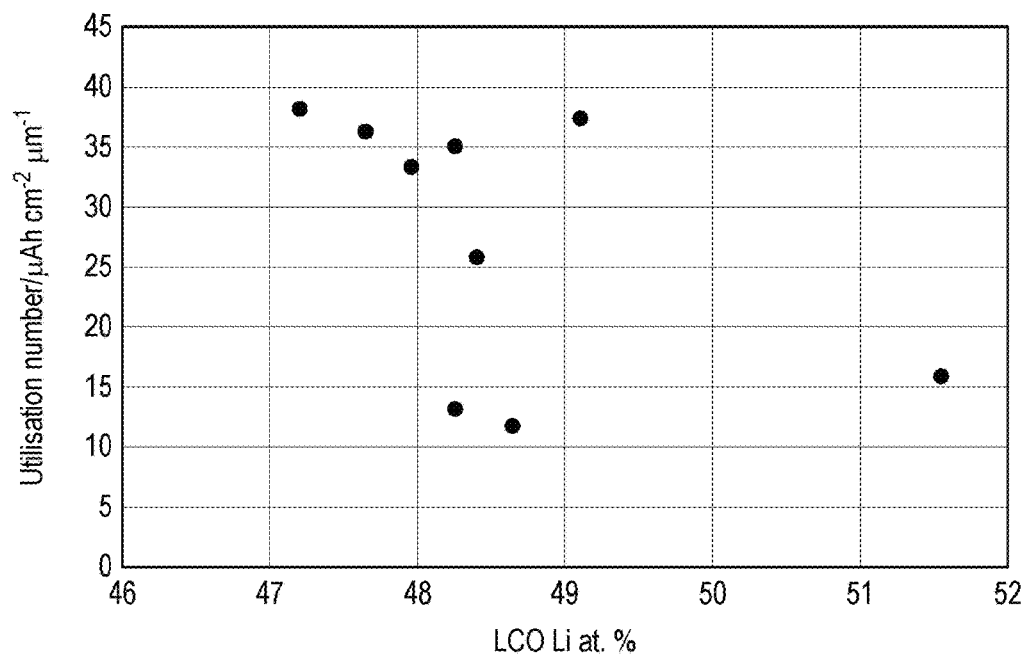
FIG. 3 shows Utilisation number (capacity normalised to area and thickness) at a temperature of 25° C. versus lithium percentage in lithium cobalt oxides when measuring the Li:Co ratio by LA-ICP-MS.

However, the properties and performance of the films produced varies showing that although the composition has a role in influencing these properties it is not the only important factor. FIG. 2 shows the cycle life for a number of these films and shows that within the Li:Co composition range of 47.5-49.1 at. % Li both high and low cycle life can be achieved (under the same cycling conditions) for different films which have the same Li:Co composition. The same is true for the utilisation number (capacity normalised to area and thickness), FIG. 3 shows a wide distribution of utilisation number within the composition range of interest.

Figure 4:
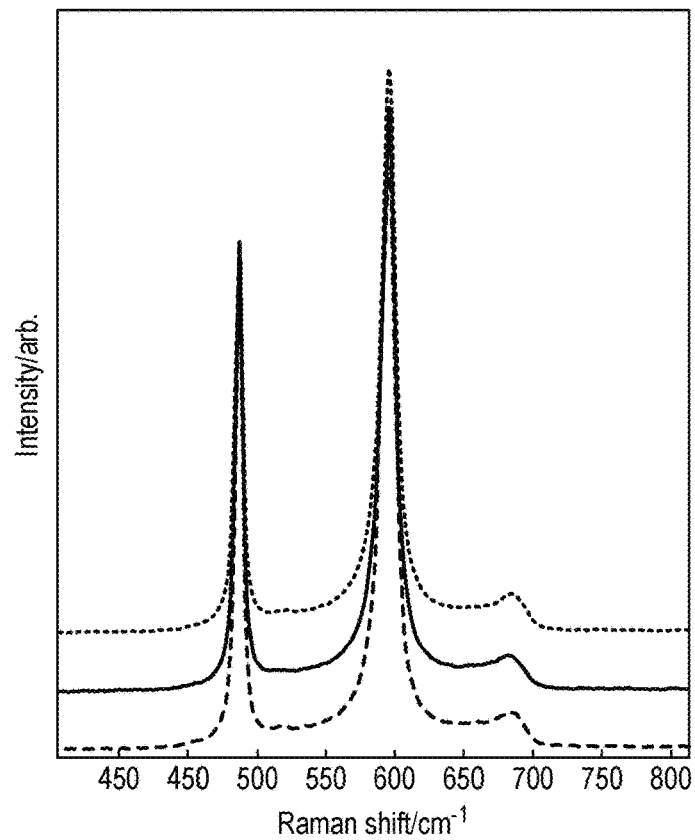
FIG. 4 shows a Raman spectrum taken on the top of a film (film 1 as described in the Examples) containing a composition according to an aspect of the invention.

The crystalline nature of the deposited $LiCoO_2$ films is demonstrated by both Raman spectroscopy and X-ray diffraction. Raman spectroscopy shows that the deposited films are of the HT-$LiCoO_2$ phase (R-3m) (FIG. 4), this high temperature phase being obtained at a relatively low substrate temperature of 400° C. due to the nature of this synthesis method which allows crystalline lithium containing materials to be deposited using lower substrate temperatures than those typically described in WO 2015/104539. The hexagonal R-3m phase consists of an ordered lamellar structure consisting of cobalt layers alternating with lithium layers (for example, as described in Porthault et al. *Vibrational Spec* 62 (2012) 152-158).

X-ray diffraction (XRD) patterns of the deposited films (FIG. 5) show the films to be primarily of the (00/) orientation, with the (003) peak at 18.9° being the strongest peak, in addition peaks at 37.4° (101), 38.4° (006), 39.1° (012) and 45.3° (104) are observed for some examples indicating the presence of crystallites with other orientations. Cross-sectional Raman spectroscopy has been carried out on these films to demonstrate the changes in the film produced by small changes during the deposition: these changes can be related to the morphology of the films.

Figure 6:
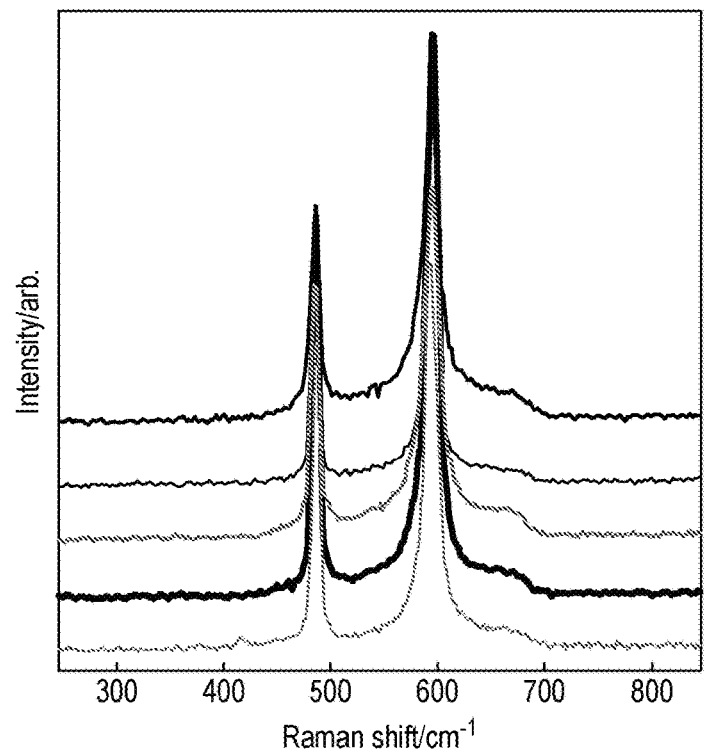
FIG. 6 shows cross-sectional Raman spectra for film 4 (not according to the invention).

FIG. 6 shows an example of a film (not produced according to the invention) where the deposition conditions remained constant for the whole deposition time (film 4): the Raman spectra can be seen to be constant through the film showing that the same phase and composition is present for the whole film thickness.

Figure 5:
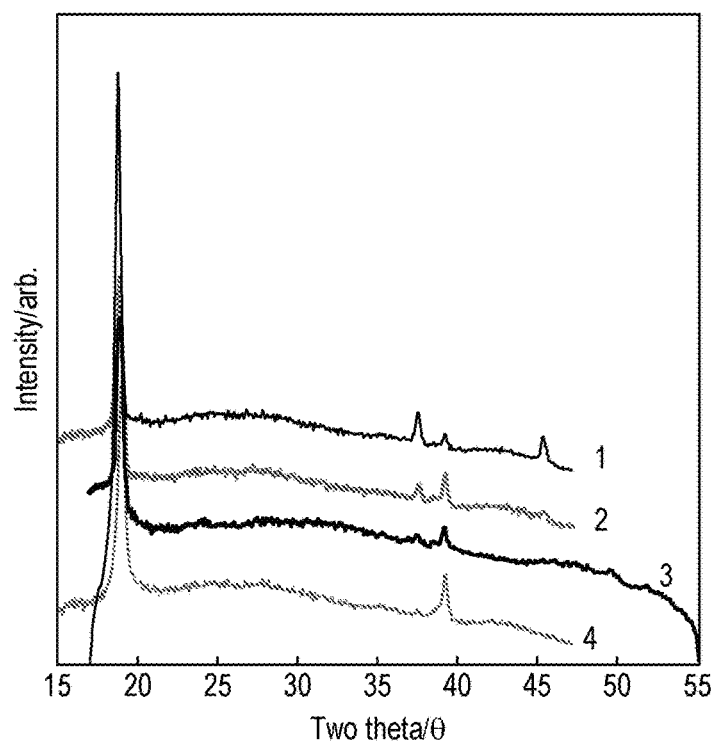
FIG. 5 shows X-ray diffractogram for films 1-3 containing a composition according to an aspect of the invention and film 4 (not according to the invention).

The film produced is smooth and flat, containing only small crystallites (FIG. 7) and X-ray Diffraction (XRD) shows that the film is preferentially orientated in the (003) direction with only peaks at 18.9 and 38.4° corresponding to the (003) and (006) orientation being observed (FIG. 5). The (001) orientation of $LiCoO_2$ has the layers of the R-3m structure formed parallel to the surface of the substrate. The two-dimensional lithium diffusion planes being parallel to the substrate makes this orientation non-ideal for electrochemical intercalation of lithium due to the long pathways the lithium is required to travel, thus limiting the rates at which the intercalation of lithium can occur and it has also been shown to yield lower than theoretical capacities (Bouwman et al. Solid-state Ionics 152 (2002) 181-188). Indeed, film 4 (not according to the invention) which is observed to be strongly (003) orientated provides only 20% of its theoretical capacity (13 $\mu Ah\ cm^{-1}$-2 $\mu m^{-1}$) by the 5th cycle discharge when cycled under the same cycling conditions as for the other films discussed, at 25° C.

Figure 7:
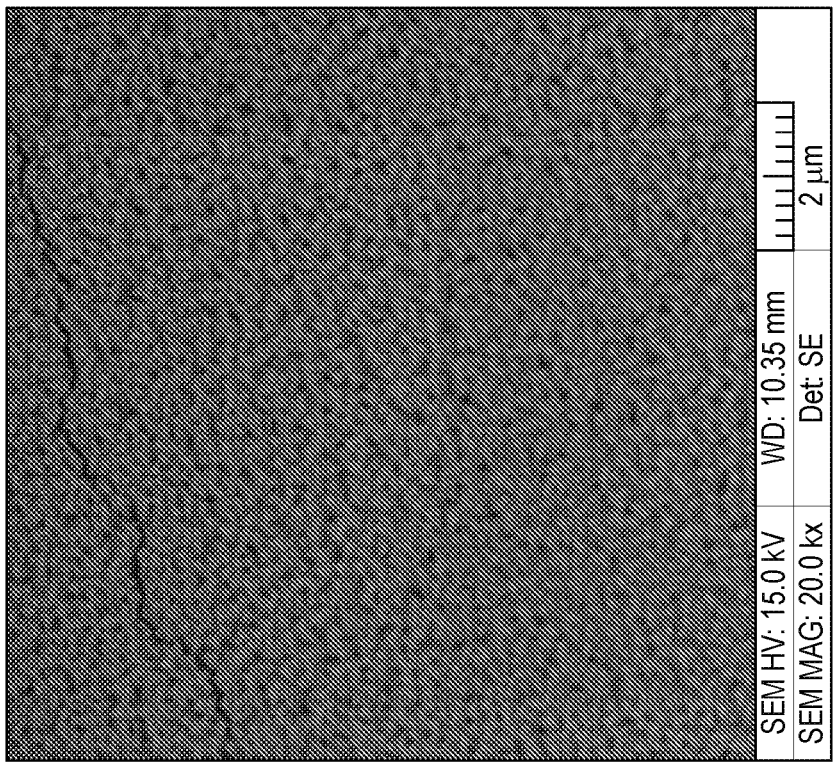
FIG. 7 shows a scanning electron microscopy (SEM) cross section and top view of the LCO layer for film 4 (not according to the invention).
Figure 7:
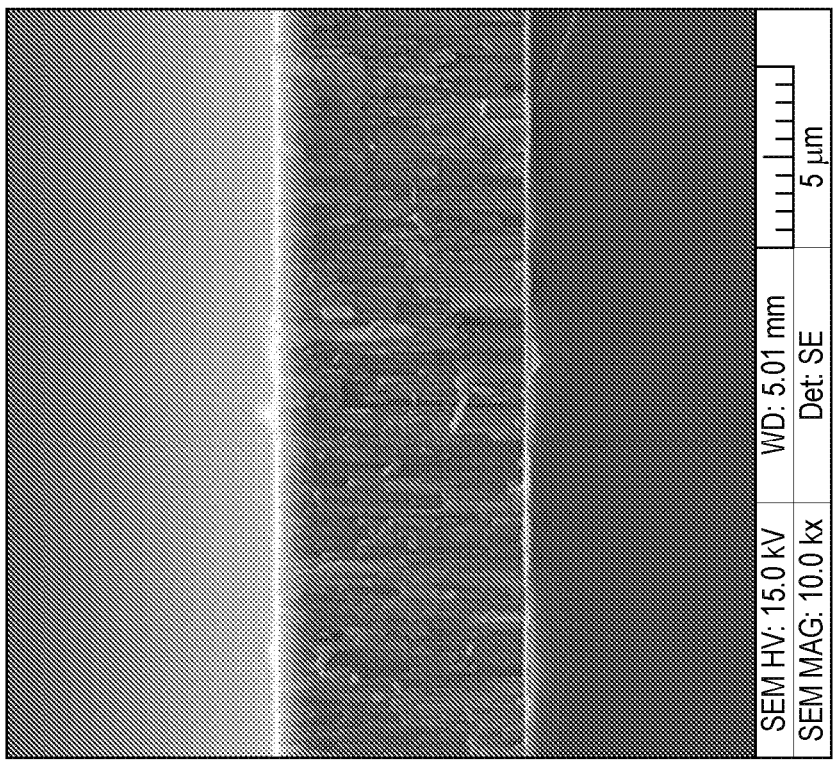

The closely packed, dense morphology of these films consists of narrow columnar crystallites arranged perpendicular to the substrate surface with widths between 100-300 (±50) nm and lengths of 0.1-7 μm (up to the full film thickness (6700 nm)) and is homogeneous in nature producing a smooth surface to the film, the SEM image of the top surface only shows small crystallites of sizes less than 350 nm when viewed from above (FIG. 7). In some instances, these films have been shown to be susceptible to cracking which can be detrimental to a solid-state battery.

Figure 8:
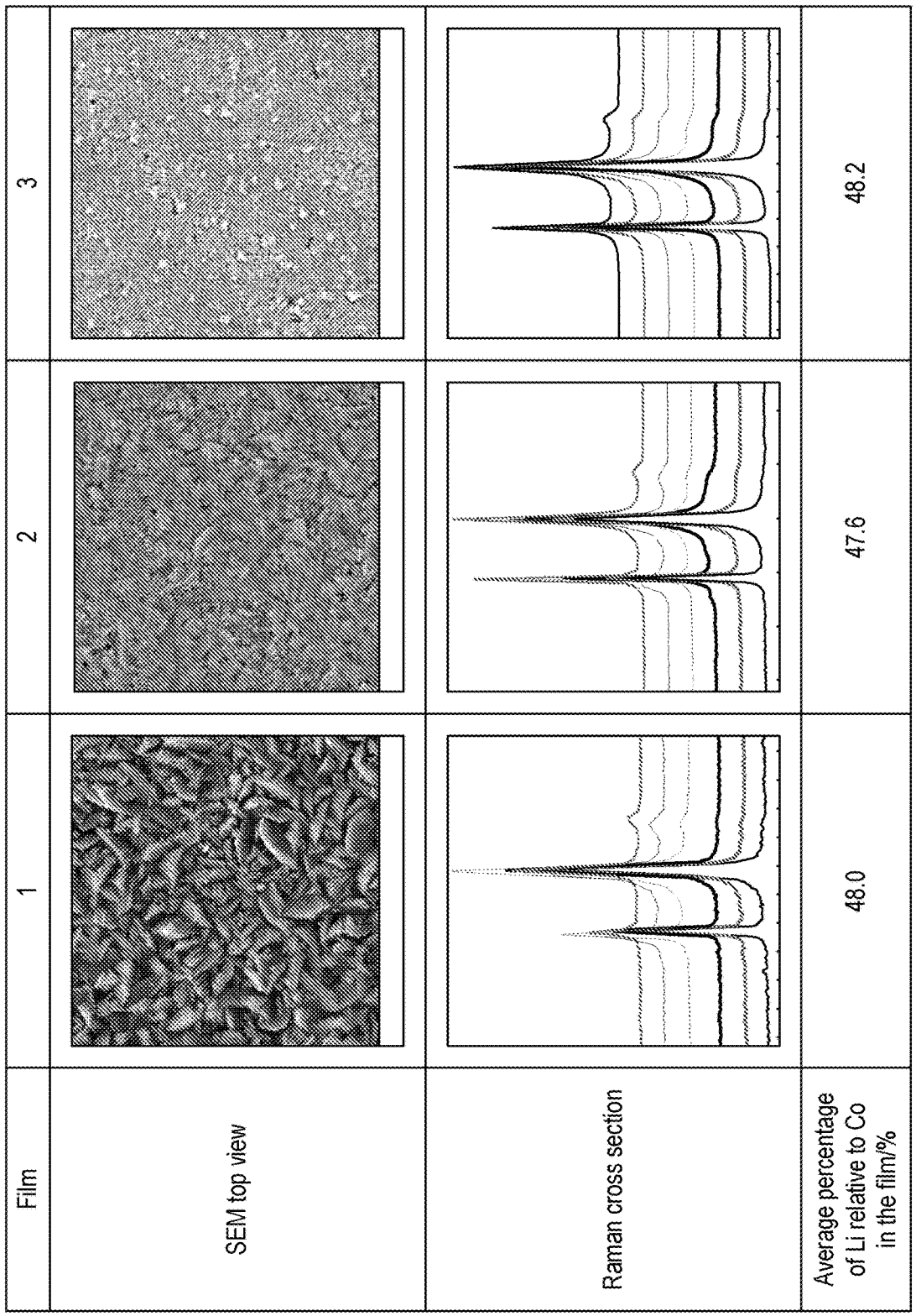
FIG. 8 shows a top view SEM, cross-sectional Raman spectra and average percentage of lithium relative to cobalt in films 1-3 according to an aspect of the invention.

FIG. 8 shows three examples of films according to embodiments of the invention where the deposition conditions change during the film deposition. The deposition starts with the Co and Li fluxes balanced to produce a film which has only the two Raman bands relating to the R-3m $LiCoO_2$ phase. Part way through the deposition the Li flux changes relative to the Co flux to slightly increase the quantity of Co in the film: this is seen in the Raman by the appearance of an extra band at 690 $cm^{-1}$ which is known to relate to the cobalt oxide phase $Co_3O_4 A_{1g}$ mode. The timing and magnitude of this change can influence the morphology of the final film and allows for the morphology to be tuned. The quantity of extra cobalt added to the film is small with the average composition of the whole LCO film remaining in the region 47-49.5% lithium.

As can be seen from FIG. 8, small variations in the deposition conditions during the film deposition results in deviations in the morphology of the deposited films. For example, larger plate-like crystallites of sizes (typically >0.3 μm) ranging from 0.4 to 2 μm in length are observed within the films: these crystallites cover more than 4% of the surface area of the film, but can cover as much as 80% of the surface area when viewed from above (Table 2), with the rest of the film consisting of the small crystallites (typically <0.3 μm) described above.

Figure 12:
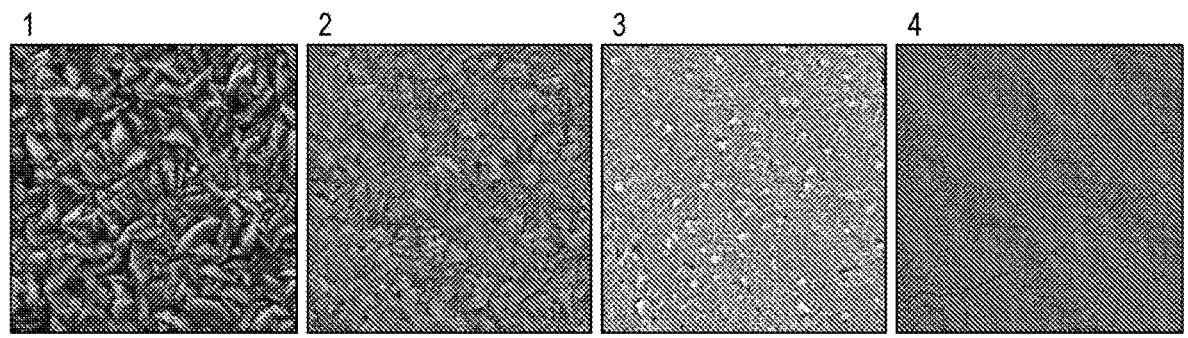
FIG. 12 shows SEMs of the films 1 to 3 (according to an aspect of the invention) and 4 (not according to the invention) for which data are provided in Tables 2 and 3.

Table 2 provides a comparison of crystallite sizes in the $LiCoO_2$ films described herein and shown in FIG. 12 (Films 1 to 3 being according to embodiments of the invention) Film 4 not according to the invention.) No crystallites are generally observed in Film 4 as it is very smooth. It was noted that the sample of Film 3 had lots of large particulates on it, making it difficult to calculate the average roughness.

TABLE 2

| Film | 1 | 2 | 3 | 4 |
|---|---|---|---|---|
| Large crystallite size/μm | 0.7-2.0 | 0.5-1.0 | 0.4-0.9 | — |
| Average area of larger crystallites/μm² | 1.2 | 0.8 | 0.3 | — |
| Surface area covered by larger crystallites/% | 79 | 22 | 5 | 0 |
| Average surface roughness ($R_a$)/nm | 110 | 59 | see above | 4 |

The XRD patterns for these films show that the films become less preferentially orientated in the (003) orientation with peaks at 37.4 and 45.3° due to the (101) and (104) orientations appearing, the intensity of these peaks becoming larger as the films have a higher surface area of larger crystallites (FIG. 5). The changes in morphology observed are believed to be because the addition of $Co_3O_4$ as a minority species acts as a seeding layer to seed growth of crystallites with different orientations ((101) and (104)) to that of the bulk of the film (003).

The addition of crystallites with different orientations will create Li diffusion pathways through the films which are not aligned parallel to the substrate which is beneficial for use in lithium-ion batteries as this will create a material with improved capacity (utilisation number) and better rate capability. Also, producing a less homogeneous film will reduce film stresses and increase the adhesion properties of the film.

Figure 9:
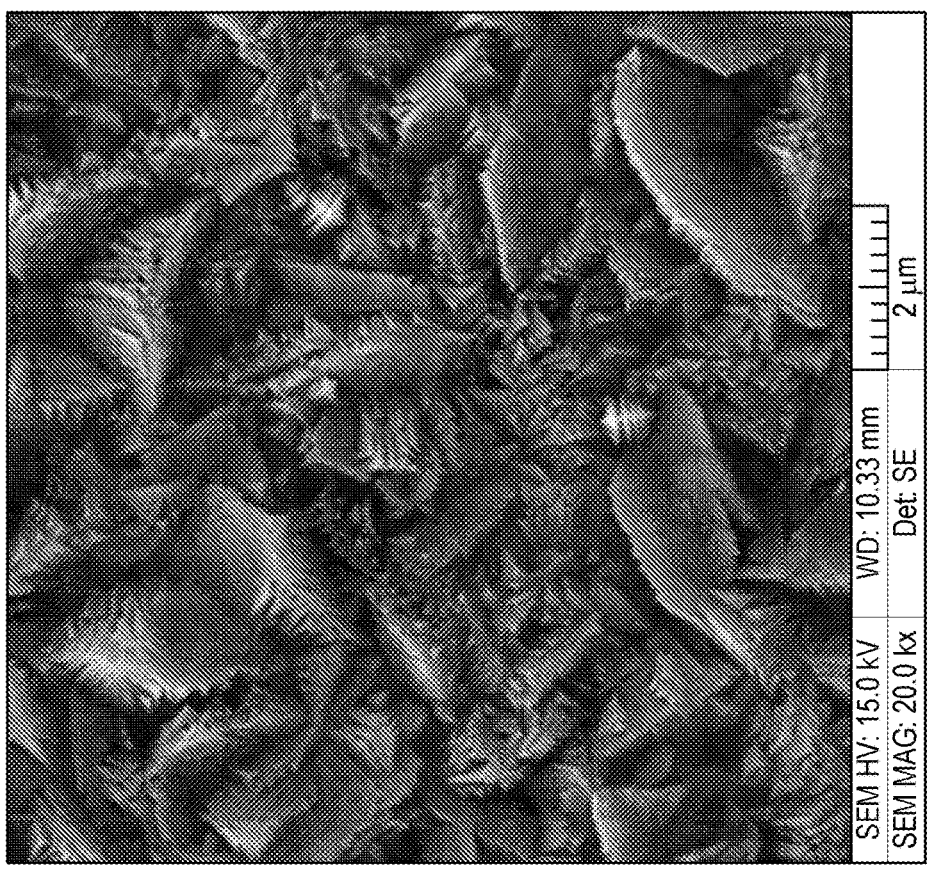
FIG. 9 shows a SEM cross section and top view of the LCO layer for film 1 according to an aspect of the invention.
Figure 9:
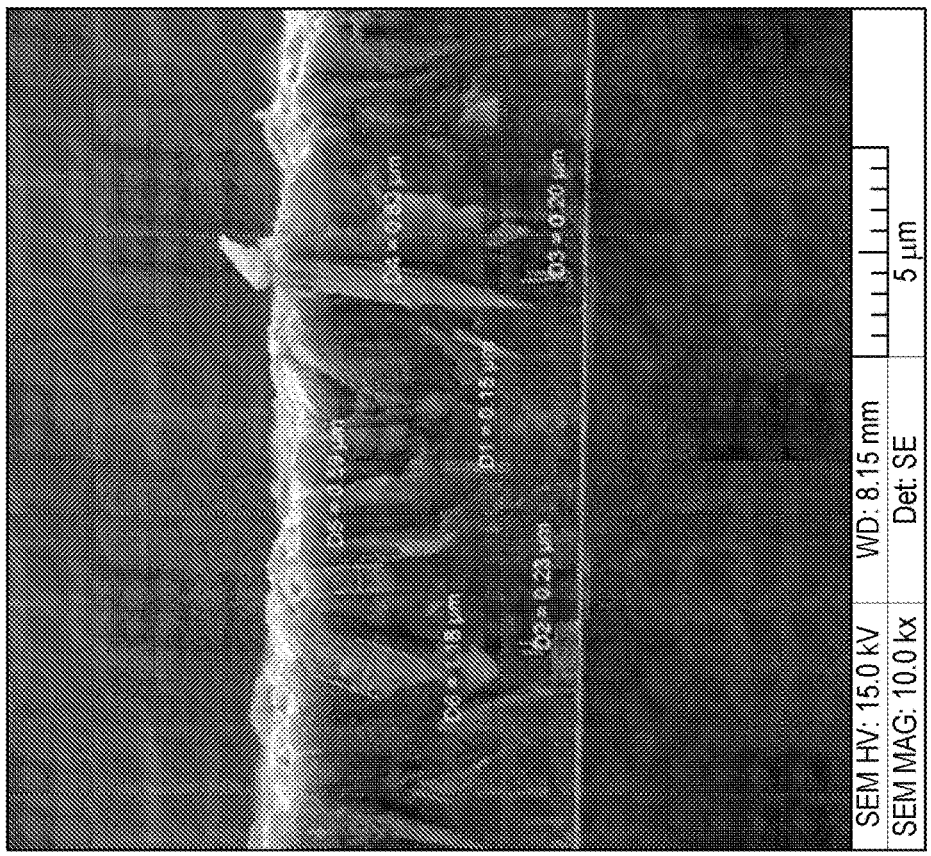

Cross sectional images of the films show that near the substrate the films consist of densely packed crystallites with widths of between 100-300 (±50) nm which are arranged perpendicular to the surface of the substrate with the same structure as observed in film 4 (described above). Once the film deposition conditions are altered to give minority species of $Co_3O_4$ which can act as a seeding layer the structure deviates from the regular small crystallite structure with larger less regular crystals growing of sizes ranging from 300-2500 nm (FIG. 9). FIG. 9 shows the cross-sectional image for film 1 and shows that once the film reaches a thickness of 3000 nm the film the morphology within the film changes, this change corresponds to the change seen in the Raman cross section and can be related to a change in the deposition conditions where the ratio of the Co to Li flux changed.

Figure 10:
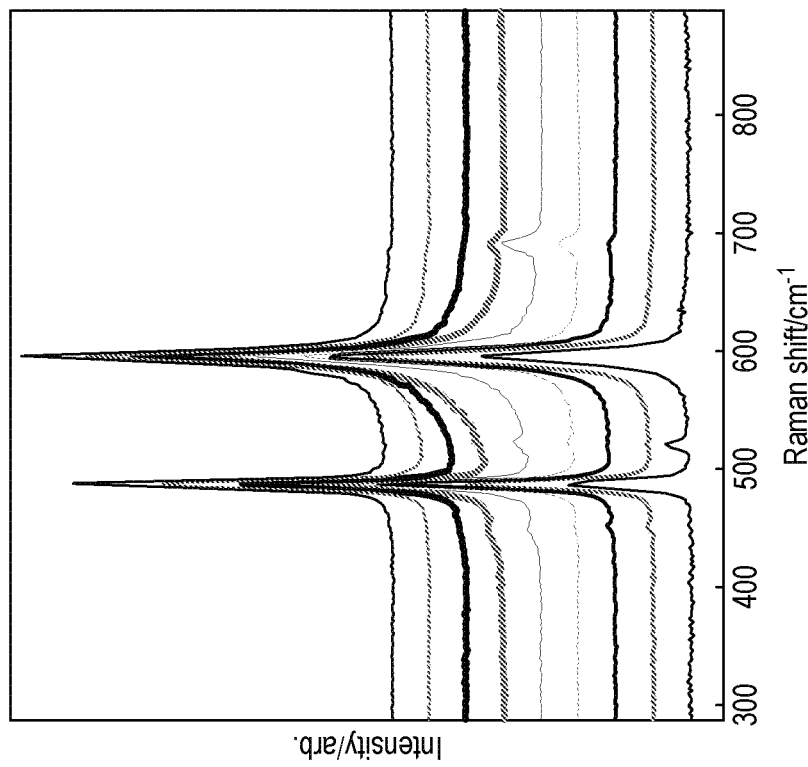
FIG. 10 shows SEM top view and cross-sectional Raman spectra for film 5 (according to an aspect of the invention) containing a layer of $Co_3O_4$ in the middle of the film.
Figure 10:
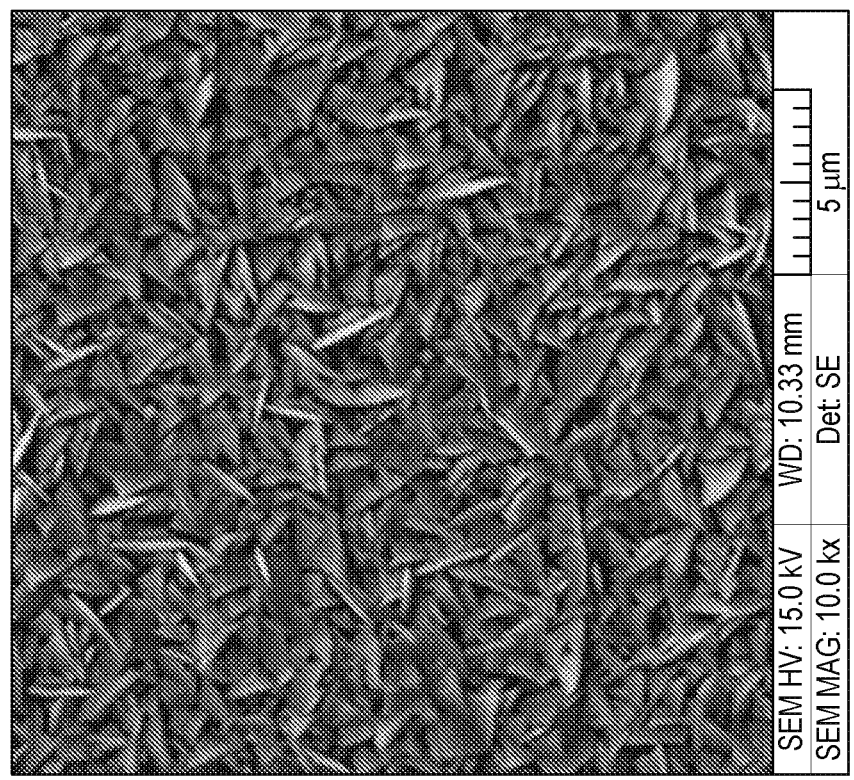

Another example (according to embodiments of the invention) shown in FIG. 10 shows film 5; film 5 was grown with a Co-rich region in the centre of the film as shown by the peak at 690 $cm^{-1}$ which is known to relate to $Co_3O_4$, although the Co-rich region is small relative to the overall film thickness the SEM image shows that the film morphology consists of large crystallites covering the vast majority (of the film surface, therefore showing that the $Co_3O_4$ has acted as a seeding layer with the lithium cobalt oxide deposited afterwards forming large plate-like crystallites. The film contains 47% at. % lithium (expressed as a proportion of the total atoms in the crystalline oxide, excluding oxygen).

The examples described above show how changing the rates of Co and Li relative to one another during the deposition of lithium cobalt oxide can be used to control the morphology of the film and that only a minority species of, for example, $Co_3O_4$ is needed to act as a seeding layer. Only small quantities of $Co_3O_4$ are needed as $Co_3O_4$ is not a cathode material, so its presence will reduce the capacity of the lithium cobalt oxide film.

Other methods that could be used to produce similar effects include depositing a seeding layer at the beginning of the lithium cobalt oxide deposition include: briefly stopping the Li flux during the deposition to produce a thin layer of $Co_3O_4$ rather than having the $Co_3O_4$ as a minor species interspersed within the lithium cobalt oxide film (a more extreme version of film 5); interrupting the lithium cobalt oxide deposition either briefly or for up to several days changing the substrate temperature during the deposition; use of an extra element either at the beginning or during the deposition to produce a seeding layer.

Similar irregularities in pulsed laser deposition (PLD) films of the prior art have been shown to enhance the lithium intercalation rate and capacity of the film when measured using a liquid electrolyte (Bouwman et al. *Solid-state Ionics* 152 (2002) 181-188). However, when using a liquid electrolyte higher intercalation rates and capacities for films with higher surface areas is often assigned to the rougher surface meaning that a bigger surface area being in contact with the liquid electrolyte which is favourable for Li intercalation and deintercalation (Jung et al. *Thin Solid Films* 546 (2013) 414-417).

As the measurements described herein are carried out on solid-state cells which contain no liquid electrolyte the same trends could not be presumed when using a solid electrolyte which does not wet the surface of an electrode in the same way as a liquid electrolyte. A liquid electrolyte can make its way into the voids between crystallites and therefore make full use of the electrodes increased surface area created by having a rougher electrode surface. However, a solid electrolyte is deposited as a film on top of the electrode and therefore it could be expected that a smoother film would be preferred for solid-state cells (as described in WO 2015/104538). Therefore, although the morphology of the $LiCoO_2$ allows for easier Li intercalation and increased capability of the $LiCoO_2$ this would not automatically lead to an increased capacity in a solid-state cell. Moreover, irregular $LiCoO_2$ films have previously been thought to be unsuitable for research due to their non-uniformity (Bouwman et al. (2002) above).

Figure 11:
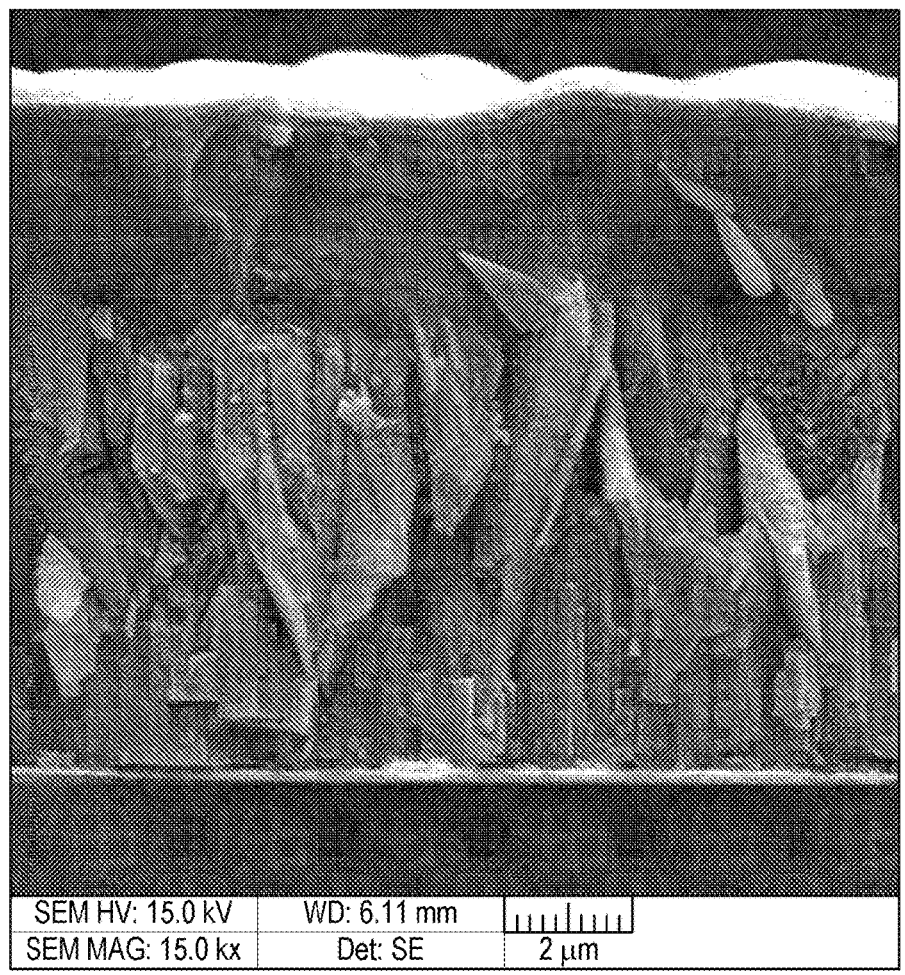
FIG. 11 shows a cross section of a solid-state battery containing $LiCoO_2$ (film 1) according to an aspect of the invention.

Here the $LiCoO_2$ films are tested in solid-state cells consisting of platinum current collectors, the $LiCoO_2$ cathode, a LiPON electrolyte and a Si anode arranged in the form $Pt/LiCoO_2/LiPON/Si/Pt$ as shown in the figure, along with an encapsulation which is not shown in the figure (FIG. 11).

The presence of larger crystallites (>0.3 µm) in the $LiCoO_2$ film is shown to improve the utilisation number (capacities) in a solid-state cell compared to only small crystallites (<0.3 µm) being present, however, surprisingly further increases in the size or surface coverage of the crystallites in the range studied has no significant effect on the utilisation achieved.

It has been reported that the capacity fade with cycling is less when a solid electrolyte covers the surface of the $LiCoO_2$ in comparison with $LiCoO_2$ tested with a liquid electrolyte: without wishing to be bound by theory, this is thought to be related to the degradation of the liquid electrolyte (Tintignac et al. *Electrochimica Acta* 60 (2012) 121-129).

Surprisingly, the films (films 1-3) according to embodiments the invention, which have the irregular crystallites show a greatly increased cycle life compared to those not according to the invention which only have the small homogeneous crystallites (film 4). As shown in Tables 2 and 3, this effect is demonstrated even for films containing only a small number (4.5% of the surface area) of larger crystallites (0.4-0.9 µm).

Table 3 shows the number of cycles achieved to 80% of the 5th cycle discharge capacity for solid-state cells containing $LiCoO_2$ films with the morphologies displayed when cycled with 100% depth of discharge at a temperature of 25° C.

TABLE 3

| Film | 1 | 2 | 3 | 4 |
|---|---|---|---|---|
| Number of cycles to 80% discharge capacity | 750 | 650 | 820 | 190 |
| Utilisation number/µAh cm$^{-2}$ µm$^{-1}$ | 33.3 | 36.4 | 35.1 | 13.2 |

In fact the films in Table 3 which cycled to 820 and 190 cycles are measured to have the same Li:Co composition (48.25 at. % Li) even though they display different film morphologies, which demonstrates the importance of the desired morphology.

The effect of the morphology of $LiCoO_2$ on the cycle life is not widely reported. It has been reported in the literature that although $LiCoO_2$ thin films of the (003) orientation yield lower capacities, they also show more stable cycling with less capacity fade than films with other (101) or (104) orientations (Kim et al. *J. Electrochem. Soc.* 151 (2004) A1062/Jung et al. *Thin Solid Films* 546 (2013) 414-417). Therefore, contrary to what is shown by the present invention, smoother films with smaller crystallites having a greater degree of (003) orientation would have been expected to have a longer cycle life.

Additional Surface Roughness Measurements

Additional surface roughness measurements were carried out on films according to embodiments of the invention (Examples A-D), as well as Comparative Example E (not according to the invention). These measurements are given in terms of the root-mean-square surface roughness, that is, the root mean square average of the profile height deviations from the mean line of the surface. The results are set out in Table 4.

TABLE 4

|  | Root-mean-square surface roughness ($R_q$)/nm |
|---|---|
| Example A | 84 |
| Example B | 147 |
| Example C | 184 |
| Example D | 83 |
| Comparative Example E | 6 |

All publications mentioned in the above specification are herein incorporated by reference. Various modifications and variations of the described methods and system of the present invention will be apparent to those skilled in the art without departing from the scope and spirit of the present invention. Although the present invention has been described in connection with specific preferred embodiments, it should be understood that the invention as claimed should not be unduly limited to such specific embodiments. Indeed, various modifications of the described modes for carrying out the invention which are obvious to those skilled in chemistry and materials science or related fields are intended to be within the scope of the following claims.

The invention claimed is:

1. A method of preparing a composition, the composition comprising:
   (a) $Co_3O_4$, and
   (b) crystalline lithium cobalt oxide or crystalline doped lithium cobalt oxide;
   said crystalline lithium cobalt oxide or crystalline doped lithium cobalt oxide comprising the following component elements:
   45 to 55 atomic % lithium;
   20 to 55 atomic % cobalt; and
   0 to 25 atomic % of at least one additional dopant element selected from the group consisting of: magnesium, calcium, strontium, titanium, zirconium, vanadium, chromium, manganese, iron, copper, ruthenium, nickel, zinc, molybdenum, boron, aluminium, gallium, tin, lead, bismuth, lanthanum, cerium, gadolinium and europium;
   wherein said atomic % is expressed as a % of total atoms of said crystalline lithium cobalt oxide or crystalline doped lithium cobalt oxide, excluding oxygen;
   wherein 0.01% to 10% total mass of said composition is $Co_3O_4$;
   wherein 90% to 99.99% total mass of said composition is crystalline lithium cobalt oxide or crystalline doped lithium cobalt oxide;
   wherein said composition has a bottom surface and a top surface;
   where said crystalline lithium cobalt oxide or crystalline doped lithium cobalt oxide has a crystalline structure characterized by at least one of the following parameters (a) to (c):
   (a) at least a portion of the crystalline structure has a crystal orientation, relative to a plane parallel to the bottom surface, selected from the group consisting of: (101), (104), (110) and (012);
   (b) a Raman spectrum comprising bands at 484 $cm^{-1}$, 593 $cm^{-1}$, and at least one band selected from the group consisting of: 690 $cm^{-1}$, 526 $cm^{-1}$, and 625 $cm^{-1}$ (each of said band ±25 $cm^{-1}$);
   (c) at least one X-ray powder diffraction peak measured using a Cu Kα X-ray source selected from the group consisting of: 2θ (±0.2°) 37.4°, 39.1°, 45.3° and 66.4°;
   the method comprising the steps of:
   providing a separate vapor source of each component element of the composition, wherein the vapour sources comprise at least a source of cobalt, a source of lithium, a source of oxygen, and, optionally, a source of at least one dopant element selected from the group consisting of: magnesium, calcium, strontium, titanium, zirconium, vanadium, chromium, manganese, iron, ruthenium, copper, molybdenum, nickel, zinc, boron, aluminium, gallium, tin, lead, bismuth, lanthanum, cerium, gadolinium and europium;
   heating a substrate to between about 30° C. and about 900° C.;
   co-depositing each said component element onto the substrate, wherein the component elements react on the substrate to form crystalline oxide comprising lithium, cobalt and optionally one or more of the dopant elements, and having a top surface and a bottom surface;
   co-depositing the cobalt and the oxygen onto the substrate, wherein the cobalt and the oxygen react on the substrate to form $Co_3O_4$;
   depositing the $Co_3O_4$ coincidentally with the crystalline oxide comprising lithium and cobalt and optionally one or more of the dopant elements and forming a mixed layer comprising the $Co_3O_4$ and the crystalline oxide comprising lithium, cobalt and optionally one or more of the dopant elements; and
   depositing the mixed layer onto an existing layer of crystalline oxide comprising lithium and cobalt and optionally one or more of the dopant elements.

2. The method of claim 1, comprising depositing a layer of crystalline oxide comprising lithium and cobalt and optionally one or more of the dopant elements on top of said mixed layer comprising $Co_3O_4$ and crystalline oxide comprising lithium and cobalt, wherein said layer of crystalline oxide comprising lithium and cobalt and optionally one or more of the dopant elements on top of said mixed layer comprises a top surface and a bottom surface, and a crystal orientation, relative to a plane parallel to the bottom surface, selected from (101), (104), (110), or a combination thereof.

3. The method of claim 1, wherein the crystalline oxide comprises a crystal orientation, relative to a plane parallel to the bottom surface, selected from (101), (104), (110), or a combination thereof.

4. The method according to claim 1, wherein the substrate is heated to about 200 to about 700° C.

5. The method according to claim 4, wherein the substrate is heated to about 300 to about 500° C.

6. The method according to claim 1, wherein said method comprises the step of varying the flux of one or more of said component elements to increase the amount of said $Co_3O_4$ formed.

7. The method of claim 6, comprising the step of reducing or eliminating the flux of lithium.

8. The method of claim 6, comprising increasing the flux of cobalt.

9. The method of claim 6, comprising decreasing the flux of oxygen.

10. The method of claim 6, comprising delivering the oxygen together with an inert gas.

11. The method according to claim 6, wherein the flux of cobalt is increased to a cobalt flux level required to deposit a mixture of crystalline oxide of lithium and cobalt and $Co_3O_4$, and the flux of lithium is maintained at a lithium flux level required to deposit a crystalline oxide of lithium and cobalt.

12. The method according to claim 6, wherein the flux of cobalt is maintained at a cobalt flux level required to deposit a crystalline oxide of lithium and cobalt, and the flux of lithium is at a level required to deposit a mixture of crystalline oxide of lithium and cobalt and $Co_3O_4$.

13. A method of preparing a composition, the composition comprising:
   (a) $Co_3O_4$, and
   (b) crystalline lithium cobalt oxide or crystalline doped lithium cobalt oxide;
   said crystalline lithium cobalt oxide or crystalline doped lithium cobalt oxide comprising the following component elements:
   45 to 55 atomic % lithium;
   20 to 55 atomic % cobalt; and
   0 to 25 atomic % of at least one additional dopant element selected from the group consisting of: magnesium, calcium, strontium, titanium, zirconium, vanadium, chromium, manganese, iron, copper, ruthenium, nickel, zinc, molybdenum, boron, aluminium, gallium, tin, lead, bismuth, lanthanum, cerium, gadolinium and europium;

wherein said atomic % is expressed as a % of total atoms of said crystalline lithium cobalt oxide or crystalline doped lithium cobalt oxide, excluding oxygen;

wherein 0.01% to 10% total mass of said composition is $Co_3O_4$;

wherein 90% to 99.99% total mass of said composition is crystalline lithium cobalt oxide or crystalline doped lithium cobalt oxide;

wherein said composition has a bottom surface and a top surface;

where said crystalline lithium cobalt oxide or crystalline doped lithium cobalt oxide has a crystalline structure characterized by at least one of the following parameters (a) to (c):

(a) at least a portion of the crystalline structure has a crystal orientation, relative to a plane parallel to the bottom surface, selected from the group consisting of: (101), (104), (110) and (012);

(b) a Raman spectrum comprising bands at 484 $cm^{-1}$, 593 $cm^{-1}$, and at least one band selected from the group consisting of: 690 $cm^{-1}$, 526 $cm^{-1}$, and 625 $cm^{-1}$ (each of said band ±25 $cm^{-1}$);

(c) at least one X-ray powder diffraction peak measured using a Cu Kα X-ray source selected from the group consisting of: 2θ (±0.2°) 37.4°, 39.1°, 45.3° and 66.4°;

the method comprising the steps of:

providing a separate vapor source of each component element of the composition, wherein the vapour sources comprise at least a source of cobalt, a source of lithium, a source of oxygen, and, optionally, a source of at least one dopant element selected from the group consisting of: magnesium, calcium, strontium, titanium, zirconium, vanadium, chromium, manganese, iron, ruthenium, copper, molybdenum, nickel, zinc, boron, aluminium, gallium, tin, lead, bismuth, lanthanum, cerium, gadolinium and europium;

heating a substrate to between about 30° C. and about 900° C.;

co-depositing each said component element onto the substrate, wherein the component elements react on the substrate to form crystalline oxide comprising lithium, cobalt and optionally one or more of the dopant elements, and having a top surface and a bottom surface;

co-depositing the cobalt and the oxygen onto the substrate, wherein the cobalt and the oxygen react on the substrate to form $Co_3O_4$; and varying the flux of one or more of said component elements to increase the amount of said $Co_3O_4$ formed;

wherein the flux of cobalt is increased to a cobalt flux level required to deposit a mixture of crystalline oxide of lithium and cobalt and $Co_3O_4$, and the flux of lithium is maintained at a lithium flux level required to deposit a crystalline oxide of lithium and cobalt.

14. A method of preparing a composition, the composition comprising:

(a) $Co_3O_4$, and (b) crystalline lithium cobalt oxide or crystalline doped lithium cobalt oxide;

said crystalline lithium cobalt oxide or crystalline doped lithium cobalt oxide comprising the following component elements:

45 to 55 atomic % lithium;

20 to 55 atomic % cobalt; and 0 to 25 atomic % of at least one additional dopant element selected from the group consisting of: magnesium, calcium, strontium, titanium, zirconium, vanadium, chromium, manganese, iron, copper, ruthenium, nickel, zinc, molybdenum, boron, aluminium, gallium, tin, lead, bismuth, lanthanum, cerium, gadolinium and europium;

wherein said atomic % is expressed as a % of total atoms of said crystalline lithium cobalt oxide or crystalline doped lithium cobalt oxide, excluding oxygen;

wherein 0.01% to 10% total mass of said composition is $Co_3O_4$;

wherein 90% to 99.99% total mass of said composition is crystalline lithium cobalt oxide or crystalline doped lithium cobalt oxide;

wherein said composition has a bottom surface and a top surface;

where said crystalline lithium cobalt oxide or crystalline doped lithium cobalt oxide has a crystalline structure characterized by at least one of the following parameters (a) to (c):

(a) at least a portion of the crystalline structure has a crystal orientation, relative to a plane parallel to the bottom surface, selected from the group consisting of: (101), (104), (110) and (012);

(b) a Raman spectrum comprising bands at 484 $cm^{-1}$, 593 $cm^{-1}$, and at least one band selected from the group consisting of: 690 $cm^{-1}$, 526 $cm^{-1}$, and 625 $cm^{-1}$ (each of said band ±25 $cm^{-1}$);

(c) at least one X-ray powder diffraction peak measured using a Cu Kα X-ray source selected from the group consisting of: 2θ (±0.2°) 37.4°, 39.1°, 45.3° and 66.4°;

the method comprising the steps of:

providing a separate vapor source of each component element of the composition, wherein the vapour sources comprise at least a source of cobalt, a source of lithium, a source of oxygen, and, optionally, a source of at least one dopant element selected from the group consisting of: magnesium, calcium, strontium, titanium, zirconium, vanadium, chromium, manganese, iron, ruthenium, copper, molybdenum, nickel, zinc, boron, aluminium, gallium, tin, lead, bismuth, lanthanum, cerium, gadolinium and europium;

heating a substrate to between about 30° C. and about 900° C.;

co-depositing each said component element onto the substrate, wherein the component elements react on the substrate to form crystalline oxide comprising lithium, cobalt and optionally one or more of the dopant elements, and having a top surface and a bottom surface;

co-depositing the cobalt and the oxygen onto the substrate, wherein the cobalt and the oxygen react on the substrate to form $Co_3O_4$; and varying the flux of one or more of said component elements to increase the amount of said $Co_3O_4$ formed;

wherein the flux of cobalt is maintained at a cobalt flux level required to deposit a crystalline oxide of lithium and cobalt, and the flux of lithium is at a level required to deposit a mixture of crystalline oxide of lithium and cobalt and $Co_3O_4$.

* * * * *